(12) United States Patent
Okutsu et al.

(10) Patent No.: US 11,881,248 B2
(45) Date of Patent: Jan. 23, 2024

(54) THREE-DIMENSIONAL SEMICONDUCTOR MODULE INCLUDING SYSTEM IN A PACKAGE (SIP) WITH IMPROVED HEAT DISSIPATION EFFICIENCY

(71) Applicant: UltraMemory Inc., Tokyo (JP)

(72) Inventors: Fumitake Okutsu, Tokyo (JP); Takao Adachi, Tokyo (JP)

(73) Assignee: ULTRAMEMORY INC., Tokyo (JP)

( * ) Notice: Subject to any disclaimer, the term of this patent is extended or adjusted under 35 U.S.C. 154(b) by 242 days.

(21) Appl. No.: 17/427,520

(22) PCT Filed: Jan. 30, 2019

(86) PCT No.: PCT/JP2019/003243
§ 371 (c)(1),
(2) Date: Jul. 30, 2021

(87) PCT Pub. No.: WO2020/157877
PCT Pub. Date: Aug. 6, 2020

(65) Prior Publication Data
US 2022/0139439 A1 May 5, 2022

(51) Int. Cl.
*G11C 5/06* (2006.01)
*G11C 11/4074* (2006.01)
(Continued)

(52) U.S. Cl.
CPC ............ *G11C 11/4074* (2013.01); *G11C 5/04* (2013.01); *G11C 7/04* (2013.01); *H01L 25/50* (2013.01);
(Continued)

(58) Field of Classification Search
CPC .......... G11C 11/4074; G11C 5/04; G11C 7/04
See application file for complete search history.

(56) References Cited

U.S. PATENT DOCUMENTS 6,265,771 B1 7/2001 Ference et al.
2006/0043581 A1* 3/2006 Prokofiev ......... H01L 23/49838
257/691
(Continued)

FOREIGN PATENT DOCUMENTS

JP 2001156248 A 6/2001
JP 2015530757 A 10/2015
(Continued)

*Primary Examiner* — Mushfique Siddique
(74) *Attorney, Agent, or Firm* — Muncy, Geissler, Olds & Lowe, P.C.

(57) ABSTRACT

The present invention provides a semiconductor module, a semiconductor member, and a method for manufacturing the same that make it possible to improve heat dissipation efficiency. This semiconductor module 1 comprises: a power supply unit 40; a RAM unit 50, which is a RAM module having a facing surface disposed so as to face an exposed surface of a logic chip 20 and an exposed surface of the power supply unit 40, the RAM module being disposed across some of a plurality of logic chip signal terminals 22 and some of a plurality of power supply unit power supply terminals 41; and a support substrate 10 having a power feeding circuit capable of feeding electrical power to the logic chip and to the power supply unit 40, one main surface of the support substrate 10 being disposed adjacent to a heat dissipation surface of the RAM unit 50, which is the surface of the RAM unit 50 opposite the facing surface. The support substrate 10 is electrically connected, using the power feeding circuit 12, to at least some of logic chip power supply terminals 21 and the other power supply unit power supply terminals 41. The support substrate 10 has, at positions overlapping the RAM unit 50, heat dissipation vias 11 that penetrate in the thickness direction and come into contact with the heat dissipation surface of the RAM unit 50.

7 Claims, 19 Drawing Sheets

(51) Int. Cl.
  *H01L 25/00* (2006.01)
  *H10B 12/00* (2023.01)
  *G11C 7/04* (2006.01)
  *G11C 5/04* (2006.01)
  *G11C 5/14* (2006.01)
  *G11C 11/4063* (2006.01)

(52) U.S. Cl.
  CPC ............ *H10B 12/02* (2023.02); *H10B 12/30* (2023.02); *G11C 5/14* (2013.01); *G11C 11/4063* (2013.01)

(56) References Cited

U.S. PATENT DOCUMENTS

| | | | |
|---|---|---|---|
| 2014/0084441 A1 | 3/2014 | Chiu | |
| 2014/0376187 A1* | 12/2014 | Baba | H05K 1/021 |
| | | | 361/699 |
| 2015/0137345 A1* | 5/2015 | Choi | H01L 23/04 |
| | | | 257/713 |
| 2015/0255411 A1* | 9/2015 | Karhade | G06F 1/1686 |
| | | | 361/679.55 |
| 2015/0323738 A1 | 11/2015 | Sekiguchi et al. | |
| 2016/0093598 A1* | 3/2016 | Jo | H01L 23/36 |
| | | | 257/713 |
| 2017/0345761 A1* | 11/2017 | Yu | H01L 21/565 |
| 2018/0182744 A1 | 6/2018 | Karhade | |
| 2019/0051642 A1* | 2/2019 | Gupta Hyde | G06F 1/3296 |

FOREIGN PATENT DOCUMENTS

| | | |
|---|---|---|
| JP | 2015216169 A | 12/2015 |
| WO | WO-2014/051786 A | 4/2014 |

\* cited by examiner

THREE-DIMENSIONAL SEMICONDUCTOR MODULE INCLUDING SYSTEM IN A PACKAGE (SIP) WITH IMPROVED HEAT DISSIPATION EFFICIENCY

TECHNICAL FIELD

The present invention relates to a semiconductor module, a semiconductor member, and a method for manufacturing the same.

BACKGROUND ART

A volatile memory (RAM), such as a dynamic random access memory (DRAM), has been known as a storage device. The DRAM is required to have a large capacity such that it can support high performance of an arithmetic unit (hereinafter referred to as a logic chip) and an increase in an amount of data. To address this, the capacity has been increased by miniaturization of the memory (memory cell array, memory chip) and planar expansion of a cell. On the other hand, this type of increase in capacity is reaching its limit because of the miniaturization resulting in feebleness to noise, an increase in die area, and other factors.

Therefore, in recent years, a technique for achieving a large capacity by way of a three-dimensional (3D) structure that is formed by stacking a plurality of planar memories has been developed. Further, a semiconductor module has been proposed in which a logic chip and a RAM are superimposed over each other so that an area required for disposing the logic chip and the RAM is reduced (see, for example, Patent Documents 1 to 3).
Patent Document 1: Japanese Unexamined Patent Application, Publication No. 2015-216169
Patent Document 2: U.S. Published Patent Application Publication, No. 2015/255411
Patent Document 3: U.S. Published Patent Application Publication, No. 2018/182744

DISCLOSURE OF THE INVENTION

Problems to be Solved by the Invention

As disclosed in Patent Documents 1 to 3, superimposing two chips over each other makes it possible to reduce a distance between the two chips. This reduction in the distance is expected to improve a bandwidth between the two chips. On the other hand, placing the two chips over a substrate means that one of the chips that is disposed closer than the other chip to the substrate is sandwiched between the substrate and the other chip. This configuration may lower heat dissipation efficiency of the chip disposed closer to the substrate. In view of the foregoing, it is favorable to achieve a configuration capable of improving the heat dissipation efficiency.

It is an object of the present invention to provide a semiconductor module and a semiconductor member that are capable of improving the heat dissipation efficiency, and a method for manufacturing such semiconductor module and member.

Means for Solving the Problems

The present invention relates to a semiconductor module including: a heat spreader; a logic chip disposed adjacent to one surface of the heat spreader, having a surface adjacent to the heat spreader and an exposed surface opposite to the surface, and including a plurality of logic chip-power supply terminals and a plurality of logic chip-signal terminals on the exposed surface; a power supply unit juxtaposed with the logic chip in an in-plane direction of the exposed surface of the logic chip, having an exposed surface facing an identical direction with respect to the exposed surface of the logic chip, and including a plurality of power supply unit-power supply terminals on the exposed surface thereof; a RAM unit as a RAM module having an opposing surface facing the exposed surface of the logic chip and the exposed surface of the power supply unit, and disposed across part of the plurality of logic chip-signal terminals and part of the plurality of power supply unit-power supply terminals; and a support substrate including a power supply circuit capable of supplying electric power to the logic chip and the power supply unit, and having one main surface adjacent to a heat dissipation surface of the RAM unit opposite to the opposing surface. The support substrate is electrically connected to at least part of the logic chip-power supply terminals and another part of the power supply unit-power supply terminals by means of the power supply circuit, and has, in a portion over which the RAM unit is superimposed, a heat dissipation via that is in contact with the heat dissipation surface of the RAM unit and penetrates the support substrate in a thickness direction.

Preferably, the power supply unit is disposed over the surface of the heat spreader where the logic chip is disposed.

Preferably, the support substrate has, on the one main surface, a recess that is recessed in the thickness direction, and is formed at a position over which the RAM unit is superimposed.

Further, the present invention relates to a semiconductor module including: a heat spreader; a logic chip disposed adjacent to one surface of the heat spreader, having a surface adjacent to the heat spreader and an exposed surface opposite to the surface, and including a plurality of logic chip-power supply terminals and a plurality of logic chip-signal terminals on the exposed surface; a power supply unit disposed juxtaposed with the logic chip in an in-plane direction of the exposed surface of the logic chip, having an exposed surface facing an identical direction with respect to the exposed surface of the logic chip, and including a plurality of power supply unit-power supply terminals on the exposed surface thereof; a RAM unit as a RAM module having an opposing surface facing the exposed surface of the logic chip and the exposed surface of the power supply unit, and disposed across part of the plurality of logic chip-signal terminals and part of the plurality of power supply unit-power supply terminals; a support substrate including a power supply circuit capable of supplying electric power to the logic chip and the power supply unit, and facing the exposed surface of the logic chip or the exposed surfaces of the power supply unit; and a heat dissipation plate disposed adjacent to a heat dissipation surface of the RAM unit.

Further, the present invention relates to a semiconductor member for use as a component for manufacturing a semiconductor module. The semiconductor member includes: a heat spreader; a logic chip disposed adjacent to one surface of the heat spreader, having a surface adjacent to the heat spreader and an exposed surface opposite to the surface, and including a plurality of logic chip-power supply terminals and a plurality of logic chip-signal terminals on the exposed surface; a power supply unit disposed over the surface of the heat spreader where the logic chip is disposed, having a surface adjacent to the heat spreader and an exposed surface opposite to the surface, and including a plurality of power supply unit-power supply terminals on the exposed surface thereof; and a RAM unit as a RAM module having an opposing surface facing the exposed surface of the logic chip and the exposed surface of the power supply unit, and disposed across part of the plurality of logic chip-signal terminals and part of the plurality of power supply unit-power supply terminals. At least part of the plurality of logic chip-power supply terminals and another part of the plurality of power supply unit-power supply terminals are exposed and connectable to a different module.

Preferably, the semiconductor module further includes a heat dissipation ball connected to one end of the heat dissipation via, and disposed on a surface of the support substrate opposite to the surface facing the RAM unit.

Further, the present invention relates to a method for manufacturing a semiconductor module. The method includes: electrically connecting a RAM unit as a RAM module to a logic chip such that a portion of an opposing surface as one surface of the RAM unit faces a portion of an exposed surface as one surface of the logic chip; electrically connecting the RAM unit to a power supply unit such that another portion of the opposing surface of the RAM unit faces a portion of an exposed surface as one surface of the power supply unit; disposing a heat spreader adjacent to another surface of the logic chip opposite to the exposed surface; disposing a support substrate such that one main surface of the support substrate becomes adjacent to a heat dissipation surface of the RAM unit opposite to the opposing surface, while bringing a heat dissipation via penetrating the support substrate in a thickness direction into contact with the heat dissipation surface; and connecting a heat dissipation ball to one end of the heat dissipation via, on another main surface of the support substrate opposite to the surface facing the RAM unit.

Further, the present invention relates to a method for manufacturing a semiconductor member for use as a component for manufacturing a semiconductor module. The method includes: disposing a logic chip and a power supply unit adjacent to each other over one surface of a heat spreader; and disposing a RAM unit as a RAM module over an exposed surface of the logic chip and an exposed surface of the power supply unit, the exposed surfaces facing away from the heat spreader, so that the RAM unit extends across the logic chip and the power supply chip.

Effects of the Invention

The present invention provides a semiconductor module and a semiconductor member that are capable of improving heat dissipation efficiency, and a method for manufacturing such semiconductor module and member.

PREFERRED MODE FOR CARRYING OUT THE INVENTION

A semiconductor module 1 and a semiconductor member 100 according to embodiments of the present invention, and a method for manufacturing the semiconductor module and member will be described with reference to FIGS. 1 to 22. The semiconductor module 1 according to each embodiment is, for example, a system in a package (SIP) that includes an arithmetic device (hereinafter, referred to as a logic chip), a RAM unit configured as a RAM module including a single layer or multilayer RAM, and a support substrate 10 over which the SIP and the RAM unit are disposed. The semiconductor module 1 is disposed on a different support substrate (e.g., a motherboard; not illustrated), and is electrically connected to the different substrate using solder balls (e.g., power supply balls). The semiconductor module 1 is supplied with electric power from the different support substrate, and is capable of transmitting and receiving data to and from the different support substrate. In the following embodiments, a MPU 20 will be described as an example of the logic chip. Further, in the following description of the embodiments, a thickness direction (height direction) of the semiconductor module 1 is denoted as the thickness direction C. With respect to the thickness direction C of the semiconductor module 1, a side where the support substrate 10 is disposed is referred to as the lower side. With respect to the thickness direction C of the semiconductor module 1, a side where the logic chip is disposed is referred to as the upper side.

First Embodiment

Figure 1:
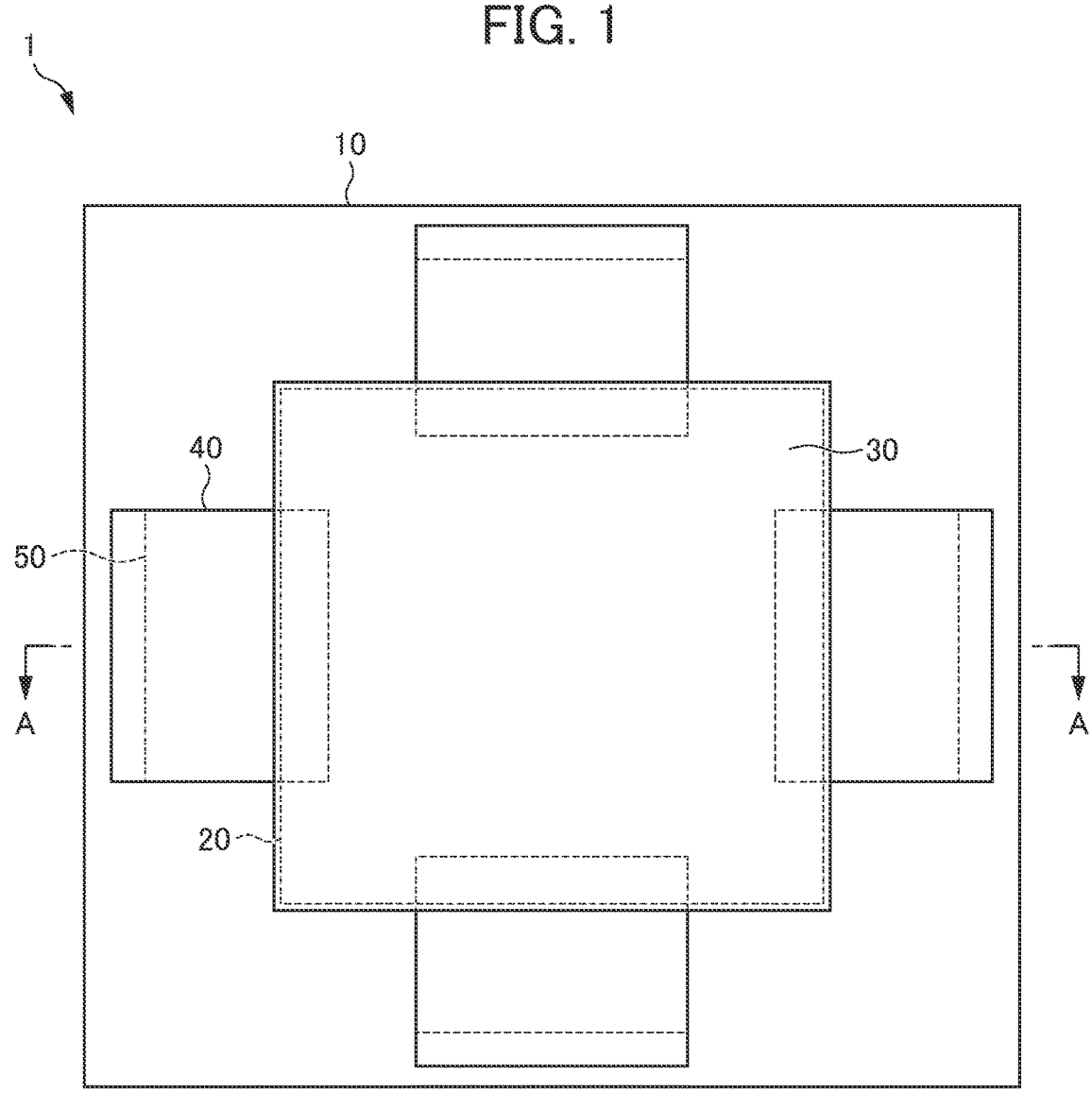
FIG. 1 is a planar view illustrating a semiconductor module according to a first embodiment of the present invention.
Figure 2:
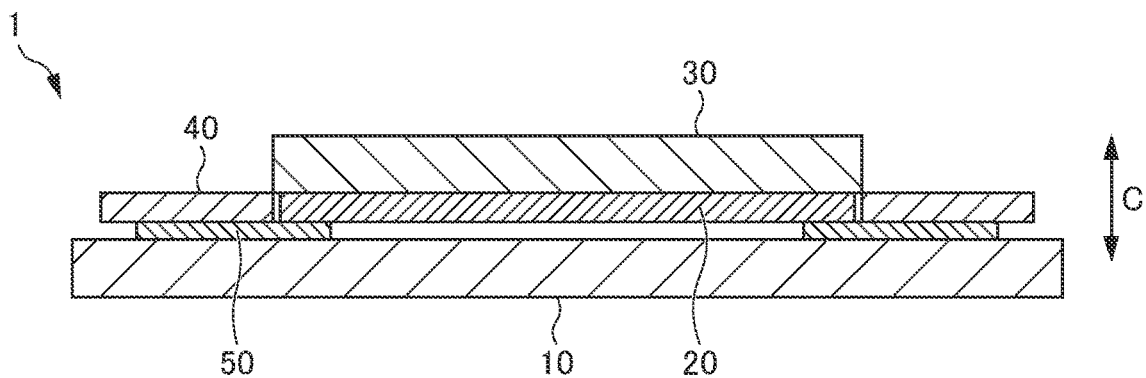
FIG. 2 is a cross-sectional view taken along line A-A in FIG. 1.
Figure 3:
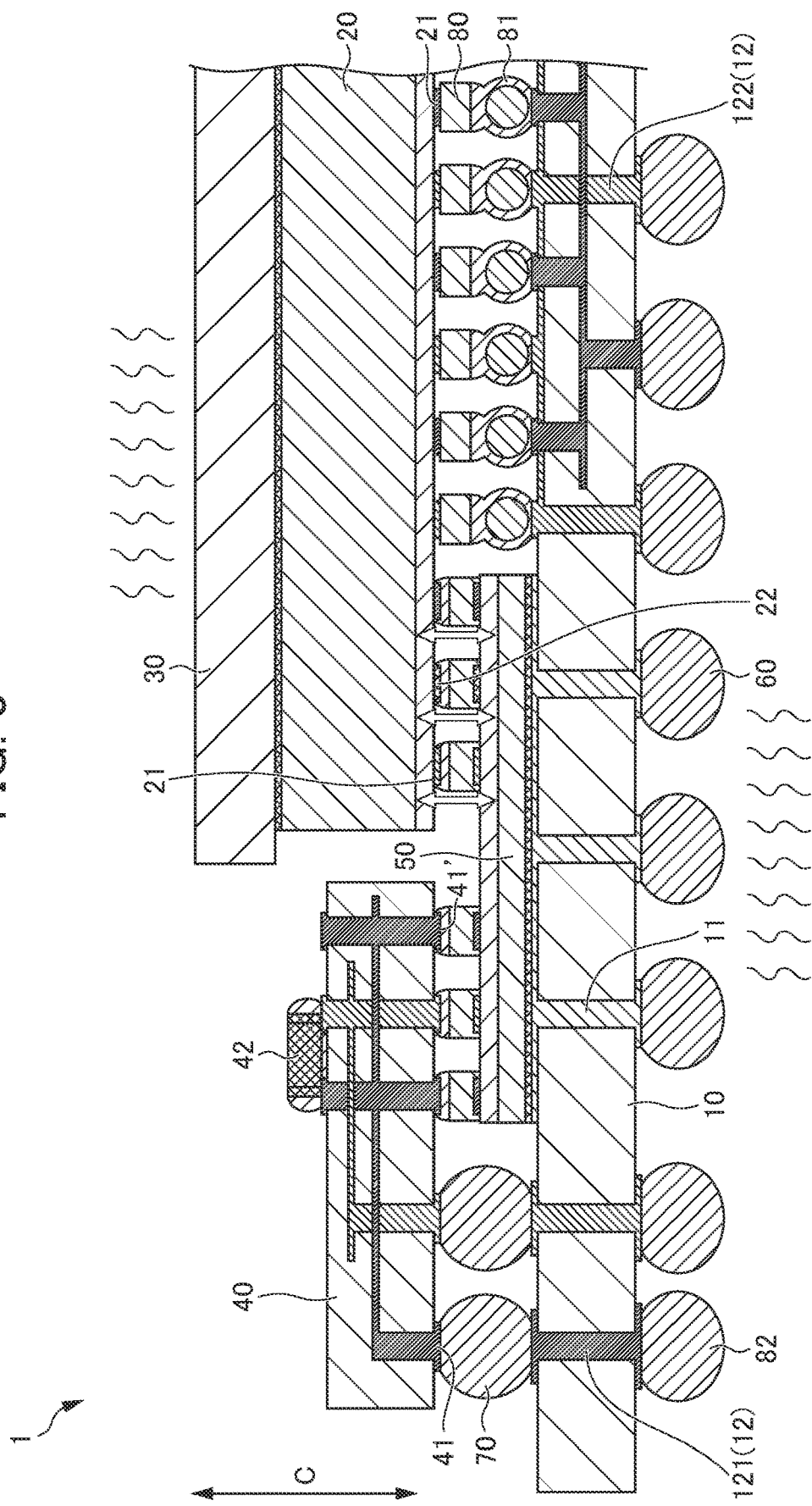
FIG. 3 is a diagram illustrating a portion of FIG. 2 at an enlarged scale.

Next, a semiconductor module 1 according to a first embodiment and a method for manufacturing the semiconductor module 1 will be described with reference to FIGS. 1 to 9. As illustrated in FIGS. 1 to 3, the semiconductor module 1 according to the first embodiment includes a heat spreader 30, a MPU 20, a power supply unit 40, a RAM unit 50, a support substrate 10, and a heat dissipation ball 60. In the semiconductor module 1 of the present embodiment, the MPU 20 includes one MPU 20, the RAM unit 50 includes four RAM units 50, and the power supply unit 40 includes four power supply units 40. These components are all disposed over the support substrate 10 including one support substrate 10.

The heat spreader 30 is made of, for example, a material having relatively high heat dissipation efficiency, such as a metal. In the present embodiment, the heat spreader 30 has a rectangular plate shape in planar view, as illustrated in FIGS. 1 to 3. The heat spreader 30 may have, for example, a heat dissipation fin (not illustrated) attached thereto.

The MPU 20 is a plate-like member having a rectangular shape in planar view. As illustrated in FIGS. 1 to 3, the MPU 20 is disposed adjacent to one surface (lower surface) of the heat spreader 30. The MPU 20 has a surface adjacent to the heat spreader 30 and an exposed surface opposite to the surface. The MPU 20 includes a plurality of logic chip-power supply terminals 21 on the exposed surface. Further, the MPU 20 includes, on the exposed surface, a plurality of logic chip-signal terminals 22 through which data can be inputted and outputted.

The power supply unit 40 is, for example, a power supply plate including a power circuit incorporated therein. In the present embodiment, each power supply unit 40 is juxtaposed with the logic chip in an in-plane direction of the exposed surface of the MPU 20. Each power supply unit 40 has an exposed surface facing the same direction with respect to the exposed surface of the MPU 20, and includes a plurality of power supply unit-power supply terminals 41 on the exposed surface. In the present embodiment, each power supply unit 40 has, for example, a bypass capacitor 42.

As illustrated in FIG. 1, each RAM unit 50 is composed of a RAM module having a rectangular shape in planar view. As illustrated in FIGS. 2 and 3, each RAM unit 50 has an opposing surface that faces the exposed surface of the MPU 20 and the exposed surface of the power supply unit 40. Specifically, each RAM unit 50 is disposed across part of the plurality of logic chip-power supply terminals 21, part of the plurality of logic chip-signal terminals 22, and part of the plurality of power supply unit-power supply terminals 41. The RAM units 50 are electrically connected to the power supply units 40, and are supplied with driving electric power from the power supply units 40. The RAM units 50 are electrically connected to the MPU 20 such that the RAM units 50 can transmit and receive signals to and from the MPU 20 (the plurality of logic chip-signal terminals 22). As in the present embodiment, it is suitable for the RAM units 50 to supply or receive electric power for interface, to or from the MPU 20. Note that the signals may be transmitted and received between the RAM units 50 and the MPU 20 in a non-contact manner, such as magnetically coupling communication or capacity coupling communication. In this case, the power for interface does not have to be supplied or received between the RAM units 50 and the MPU 20.

As illustrated in FIG. 1, the support substrate 10 is a plate-like member having a rectangular shape in planar view. The support substrate 10 has, in planar view, an area that allows the MPU 20 and the RAM units 50 to be disposed thereover. The support substrate 10 is disposed such that one main surface of the support substrate 10 is adjacent to a heat dissipation surface of each RAM unit 50 opposite to the opposing surface. The support substrate 10 includes therein a power supply circuit 12 capable of supplying electric power to the MPU 20 and the power supply units 40. Further, the support substrate 10 has, at a position over which the RAM unit 50 is superimposed, one or more heat dissipation vias 11 that are in contact with the heat dissipation surface of the RAM unit 50 and penetrate the support substrate 10 in the thickness direction C. The heat dissipation via 11 of the support substrate 10 is connected to the heat dissipation surface of the RAM unit 50 by means of, for example, thermally conductive grease or a thermally conductive sheet (not illustrated) provided between the heat dissipation surface of the RAM unit 50 and the heat dissipation via 11. In the present embodiment, the support substrate 10 includes, as the power supply circuit 12, a power supply unit-connecting circuit 121 for supplying electric power to the power supply units 40, and a logic chip-connecting circuit 122 for supplying electric power to the MPU 20. The support substrate 10 is disposed such that the one main surface thereof is adjacent to the heat dissipation surface of the RAM unit 50 opposite to the opposing surface. The power supply unit-connecting circuit 121 of the support substrate 10 is electrically connected to the power supply units 40 (the power supply unit-power supply terminals 41) through, for example, solder balls 70. The logic chip-connecting circuit 122 of the support substrate 10 is electrically connected to the MPU 20 (the plurality of logic chip-power supply terminals 21) through, for example, Cu pillars 80 and Cu core balls 81. The support substrate 10 is disposed over a different support substrate (not illustrated). In the present embodiment, the support substrate 10 is electrically connected to the different support substrate, by means of the power supply circuit 12 exposed from another main surface of the support substrate 10 and power supply balls 82 disposed between the support substrate 10 and the different support substrate. Referring to FIG. 3, a connection portion between the support substrate 10 and the MPU 20, a connection portion between the support substrate 10 and the power supply unit 40, a space between a connection portion between the RAM unit 50 and the MPU 20 and a connection portion between the RAM unit 50 and the power supply unit 40, and the RAM unit 50 are filled and sealed with an underfill material (not illustrated).

The heat dissipation balls 60 are made of a material having higher heat dissipation efficiency (a higher thermal conductivity) than the support substrate 10. The heat dissipation balls 60 are made of, for example, a metal. Specifically, each heat dissipation ball 60 is a solder ball. The heat dissipation balls 60 are disposed on a surface of the support substrate 10 opposite to the one main surface. Each heat dissipation ball 60 is connected to one end of the heat dissipation via 11. Specifically, the heat dissipation ball 60 is connected to the one end of the heat dissipation via 11, the one end being exposed from the surface of the support substrate 10 opposite to the one main surface. The heat dissipation ball 60 is disposed while having its surface exposed, except for a connection surface connected to the heat dissipation via 11. That is, the heat dissipation ball 60 is disposed such that its surface other than the surface in contact with the heat dissipation via 11 is in contact with the external atmosphere or the different support substrate.

Next, an operation of the semiconductor module 1 according to the present embodiment will be described. First, the support substrate 10 supplies electric power to the MPU 20 through the power supply circuit 12. Specifically, the support substrate 10 supplies the logic chip-power supply terminals 21 with electric power from the power supply circuit 12. The support substrate 10 also supplies the MPU 20 with ground (a ground potential) from the power supply circuit 12. The support substrate 10 supplies electric power to the power supply units 40 through the power supply circuit 12. Specifically, the support substrate 10 supplies the power supply unit-power supply terminals 41 with electric power from the power supply circuit 12. Further, the support substrate 10 supplies the power supply units 40 with ground (a ground potential) from the power supply circuit 12. The power supply units 40 supply electric power and ground to the RAM units 50 through the power supply unit-power supply terminals 41. In this way, the MPU 20 and the RAM units 50 are electrically driven.

In a case where signals are transmitted and received between the MPU 20 and the RAM unit 50, it is suitable that at least one of the MPU 20 or the RAM unit 50 supplies the other with electric power for interface. Further, the MPU 20 or the RAM unit 50 transmits a signal including data to the other. According to the present embodiment, since transmission paths through which the signals are transmitted can be shortened, high-speed and low-power signal transmission can be achieved.

Heat generated in the MPU 20 due to the operation of the MPU 20 is released across an upper surface of the MPU 20 through the heat spreader 30. This configuration inhibits the MPU 20 from overheating. On the other hand, heat generated in each RAM unit 50 due to the operation of the RAM unit 50 is released across the other main surface of the support substrate 10 through the heat dissipation vias 11 and the heat dissipation balls 60. This configuration inhibits the RAM units 50 from overheating.

Figure 4:
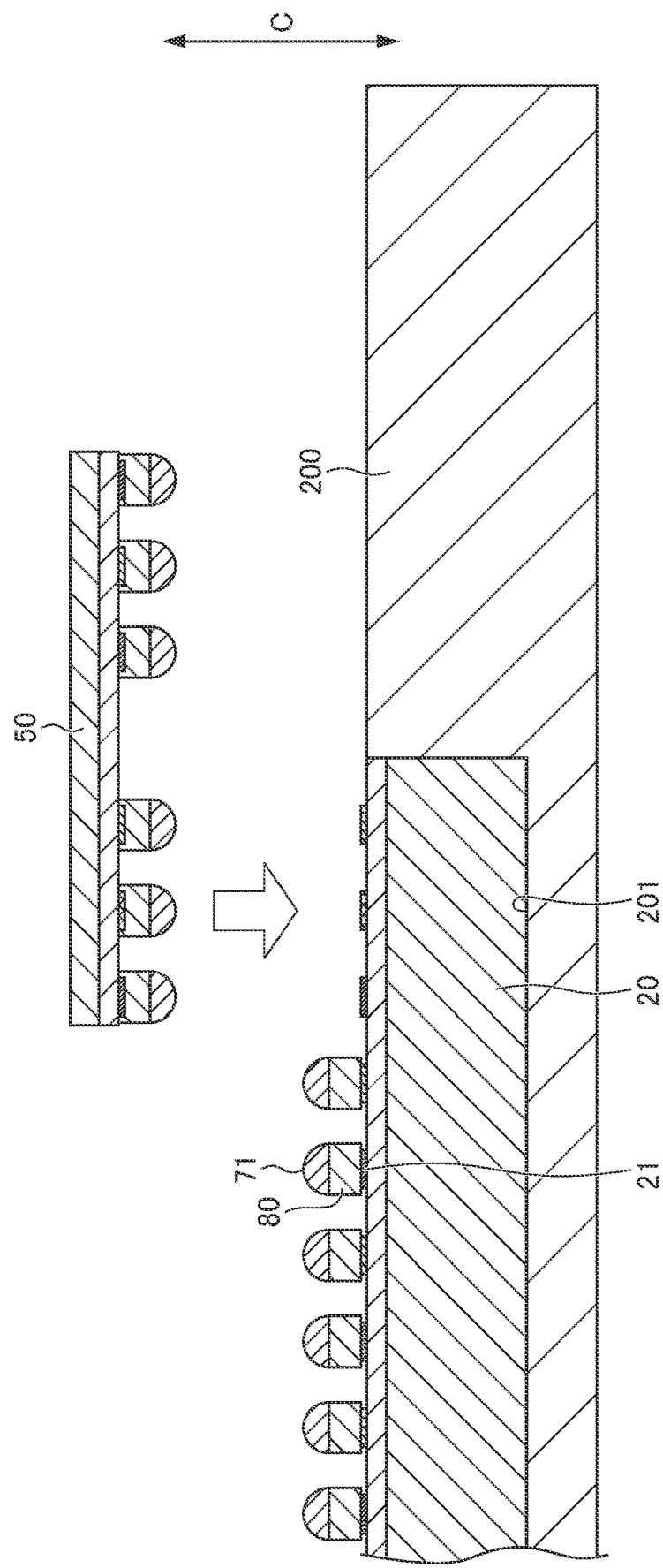
FIG. 4 is a diagram schematically illustrating a step of a process for manufacturing the semiconductor module of the first embodiment.

Next, a method for manufacturing the semiconductor module 1 will be described. First, as shown in FIG. 4, a die bonding jig 200 having a receiving portion 201 recessed downward in the thickness direction C is provided. The receiving portion 201 of the die bonding jig 200 has the same or substantially the same depth as the thickness of the MPU 20. The MPU 20 is received in the receiving portion 201, while having the exposed surface facing upward.

Next, each RAM unit 50 is placed such that a portion thereof is superimposed over and connected to a portion of the MPU 20. For example, an end portion of the RAM unit 50 in an in-plane direction of the opposing surface of the RAM unit 50 is superimposed over and connected to an end portion of the MPU 20 in an in-plane direction of the exposed surface of the MPU 20. Here, each Cu pillar 80 has, at the tip thereof, a solder bump 71 for solder connection. Thus, each RAM unit 50 and the MPU 20 are electrically connected to each other. In the present embodiment, end portions corresponding to the four sides of the exposed surface of the MPU 20 are each connected to a portion of the opposing surface of the RAM unit 50. In other words, the four RAM units 50 are respectively connected to positions corresponding to the four sides of the one MPU 20.

Figure 5:
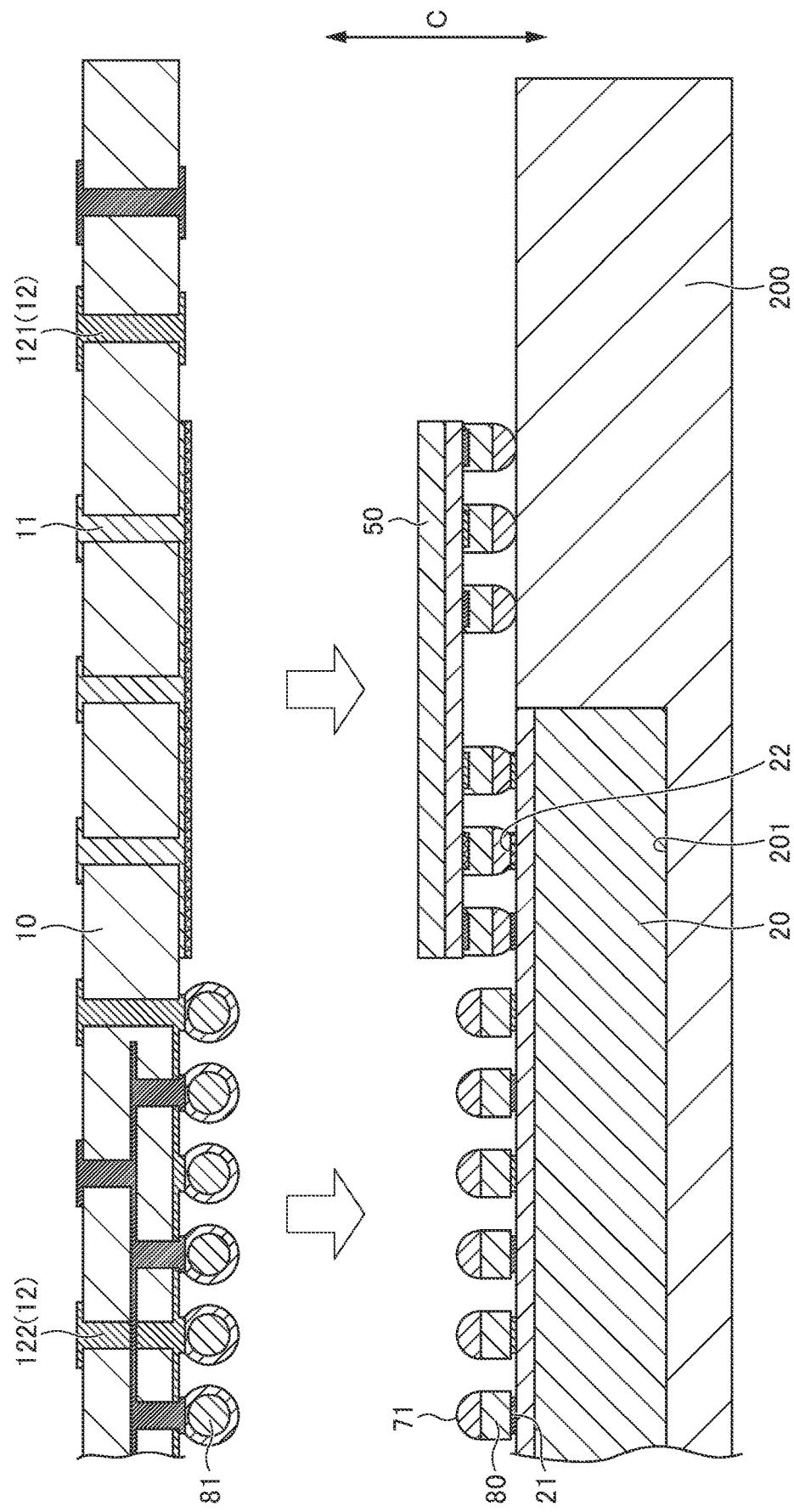
FIG. 5 is a diagram schematically illustrating a step of the process for manufacturing the semiconductor module of the first embodiment.
Figure 6:
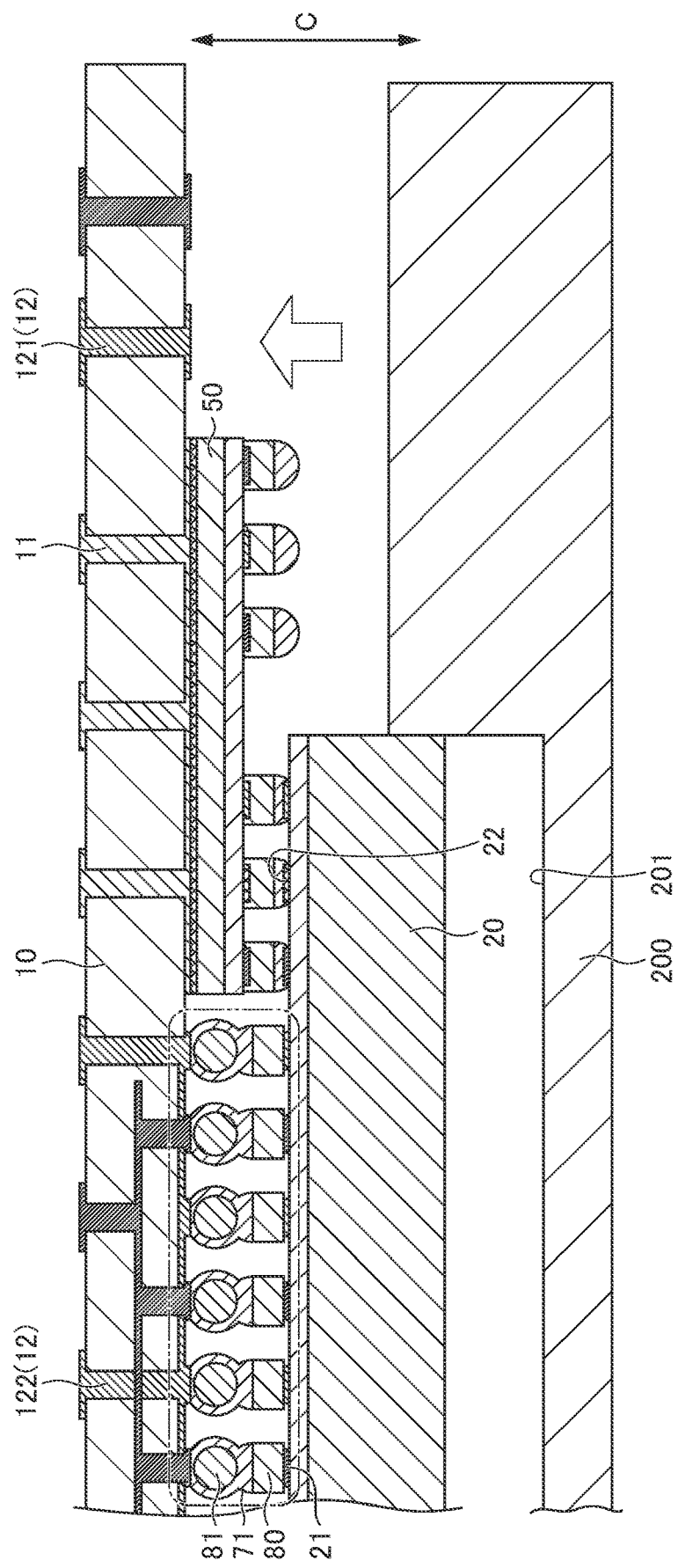
FIG. 6 is a diagram schematically illustrating a step of the process for manufacturing the semiconductor module of the first embodiment.

Next, as illustrated in FIG. 5, the support substrate 10 is superimposed over the heat dissipation surfaces of the RAM units 50. Further, the support substrate 10 is electrically connected to the MPU 20. For example, grease (a thermally conductive material) is applied to a portion of the one main surface of the support substrate 10, the portion to be superimposed over each RAM unit 50. Further, on the support substrate 10, the Cu core balls 81 are disposed at positions to be connected to the MPU 20. One surface of the support substrate 10 is superimposed over the MPU 20 and the RAM units 50. Then, as illustrated in FIG. 6, the support substrate 10, the MPU 20, and the RAM units 50 are removed from the die bonding jig 200.

Figure 7:
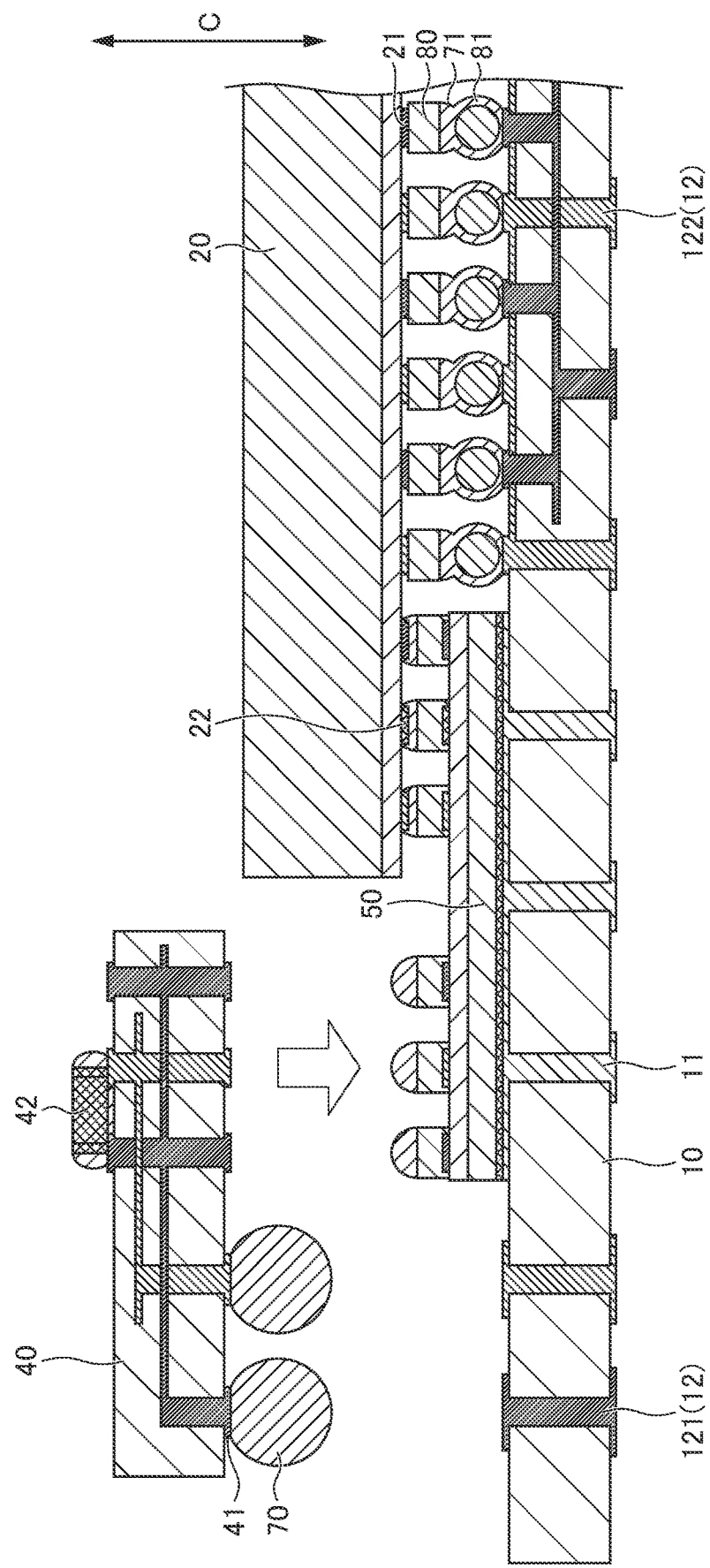
FIG. 7 is a diagram schematically illustrating a step of the process for manufacturing the semiconductor module of the first embodiment.

Next, as illustrated in FIG. 7, power supply units 40 are each disposed across a portion of the opposing surface of the RAM unit 50 and the support substrate 10. Specifically, the power supply unit 40 is connected to an exposed region of the opposing surface of the RAM unit 50, while having a portion of its exposed surface superimposed over the exposed region. Further, the other portion of the exposed surface of the power supply unit 40 is superimposed over and connected to the one main surface of the support substrate 10. Thereafter, sealing with the underfill material (not illustrated) is provided, as described above with reference to FIG. 3.

Figure 8:
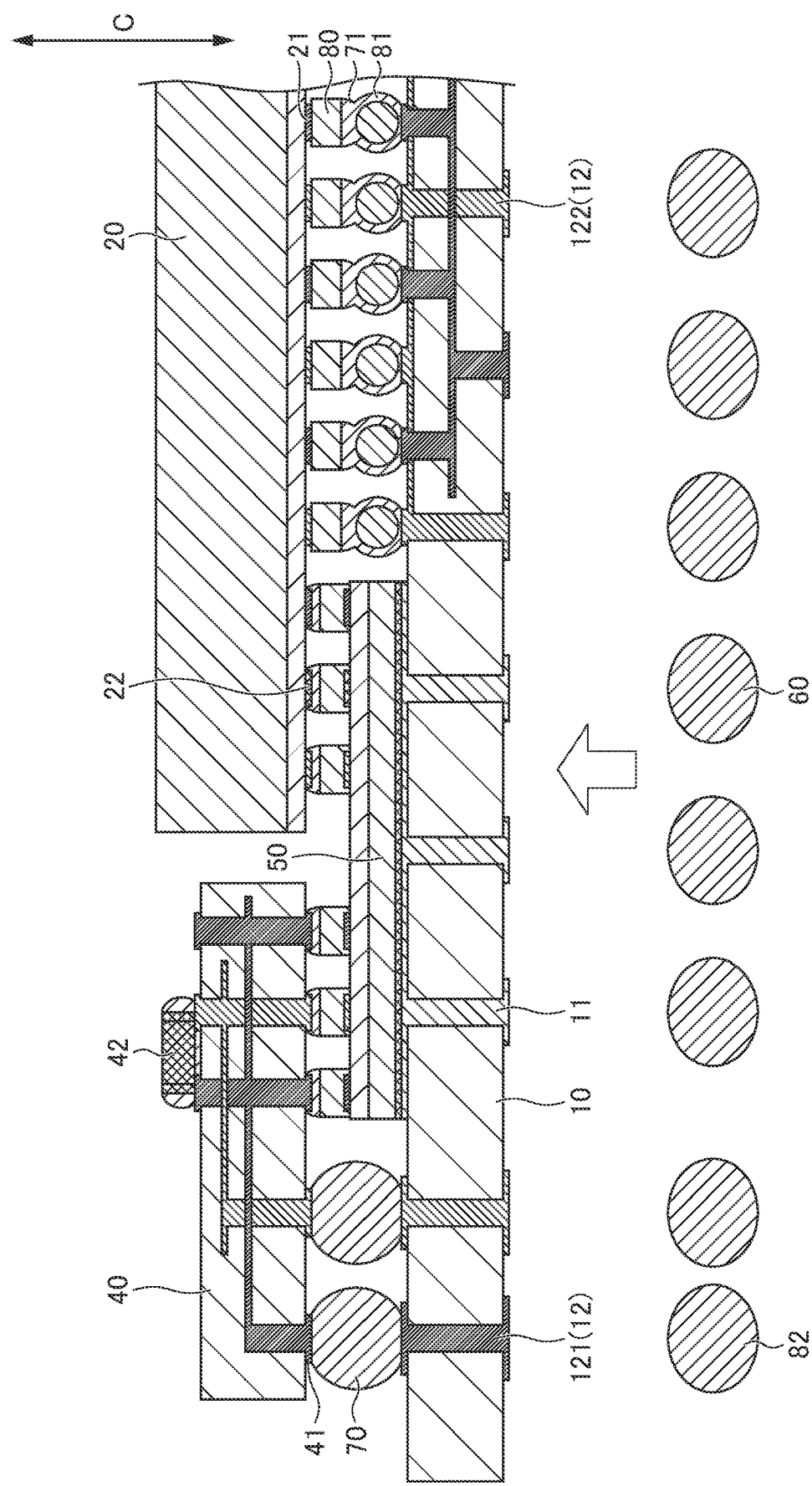
FIG. 8 is a diagram schematically illustrating a step of the process for manufacturing the semiconductor module of the first embodiment.

Next, as illustrated in FIG. 8, the power supply balls 82 for connection with a different support substrate are disposed on the other main surface of the support substrate 10. Further, the heat dissipation balls 60 to be connected to the heat dissipation vias 11 are disposed on the other main surface of the support substrate 10.

Figure 9:
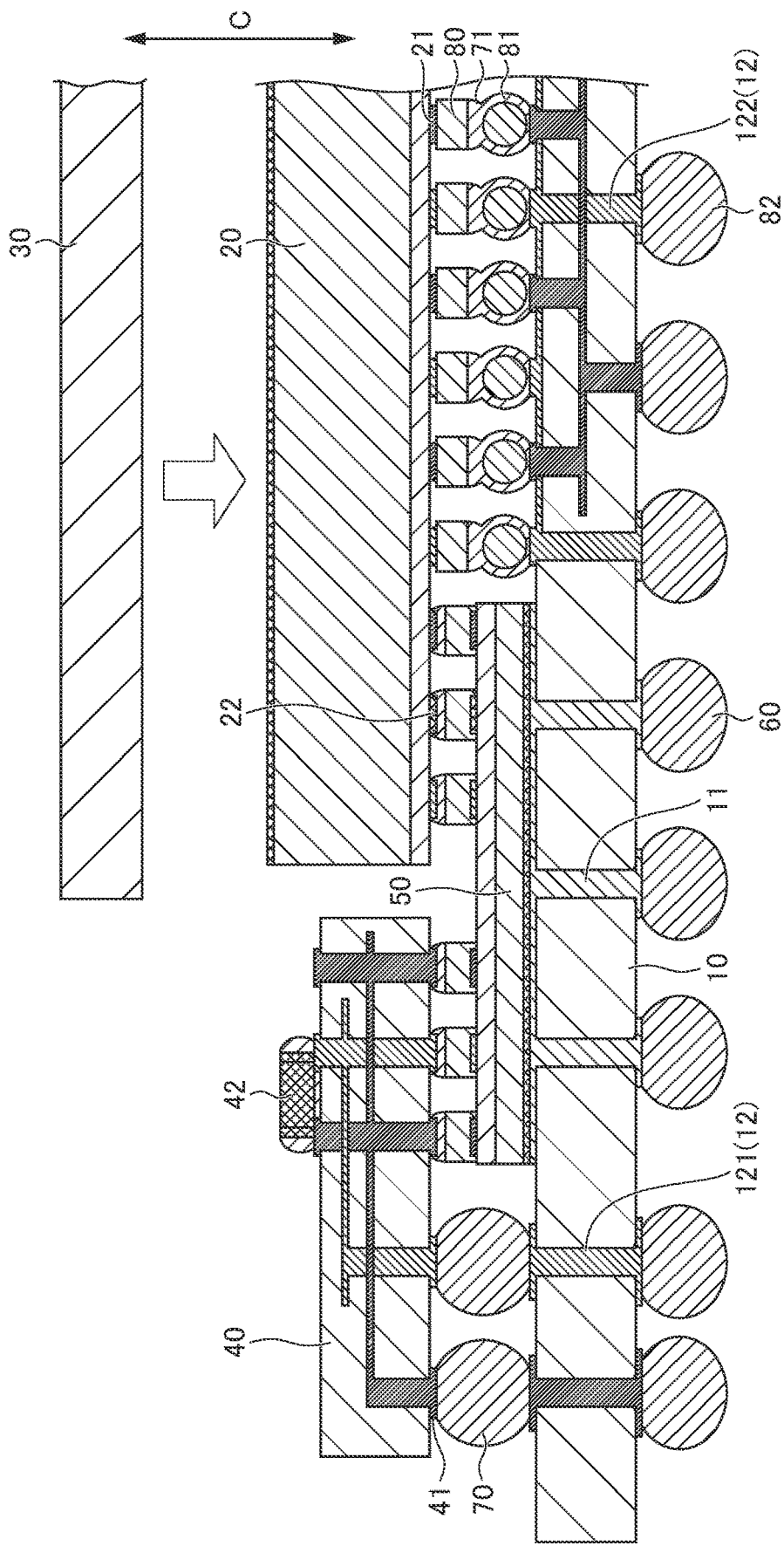
FIG. 9 is a diagram schematically illustrating a step of the process for manufacturing the semiconductor module of the first embodiment.

Next, as illustrated in FIG. 9, the heat spreader 30 is placed over the upper surface of the MPU 20. For example, the heat spreader 30 is disposed adjacent to the MPU 20 with the interposition of grease (a thermally conductive material) provided on the upper surface of the MPU 20.

The above-described semiconductor module 1 according to the first embodiment and the method for manufacturing the same exert the following effects.

(1) The semiconductor module 1 includes: the heat spreader 30; the logic chip disposed adjacent to one surface of the heat spreader 30, and having the exposed surface opposite to a surface adjacent to the heat spreader 30, and including the plurality of logic chip-power supply terminals 21 and the plurality of logic chip-signal terminals 22 on the exposed surface; the power supply unit 40 juxtaposed with the logic chip in an in-plane direction of the exposed surface of the logic chip, having the exposed surface facing the identical direction with respect to the exposed surface of the logic chip, and including the plurality of power supply unit-power supply terminals 41 on the exposed surface; the RAM unit 50 as a RAM module having the opposing surface facing the exposed surface of the logic chip and the exposed surface of the power supply unit 40, and disposed across part of the plurality of logic chip-power supply terminals 21, part of the plurality of logic chip-signal terminals 22, and part of the plurality of power supply unit-power supply terminals 41; and the support substrate 10 including the power supply circuit 12 capable of supplying electric power to the logic chip and the power supply unit 40, and having one main surface adjacent to the heat dissipation surface of the RAM unit 50 opposite to the opposing surface. The support substrate 10 is electrically connected to another part of the logic chip-power supply terminals 21 and another part of the power supply unit-power supply terminals 41 by means of the power supply circuit 12, and has, in a portion over which the RAM unit 50 is superimposed, the heat dissipation via 11 that is in contact with the heat dissipation surface of the RAM unit 50 and penetrates the support substrate 10 in the thickness direction C. This feature provides a heat dissipation path for the RAM unit 50, and makes it possible to inhibit the RAM unit 50 from overheating, thereby enabling further prolongation of the product life. It is suitable for the RAM unit 50 to include the terminals only on the opposing surface, whereas the heat dissipation surface does not have to be provided with any terminals. This feature eliminates the need to provide the RAM unit 50 with a TSV or the like for power supply, thereby enabling reduction in manufacturing costs of the semiconductor module 1.

(2) The semiconductor module 1 further includes the heat dissipation ball 60 that is connected to one end of the heat dissipation via 11 and is disposed on a surface of the support substrate 10 opposite to the surface facing the RAM unit 50. This feature makes it possible to ensure the heat dissipation path for the RAM unit 50, thereby enabling enhancement of heat dissipation efficiency.

Second Embodiment

Figure 10:
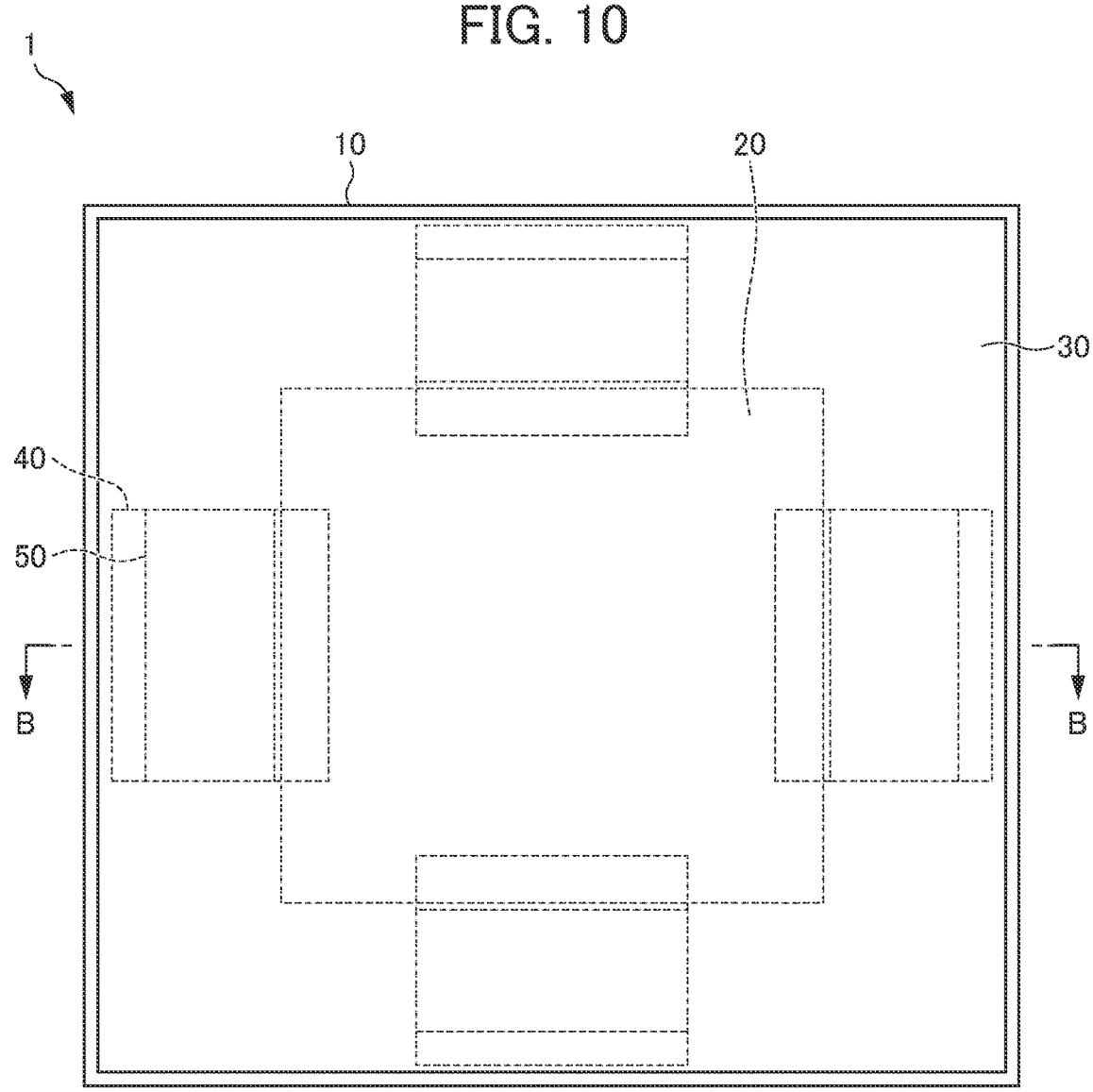
FIG. 10 is a planar view illustrating a semiconductor module according to a second embodiment of the present invention.
Figure 11:
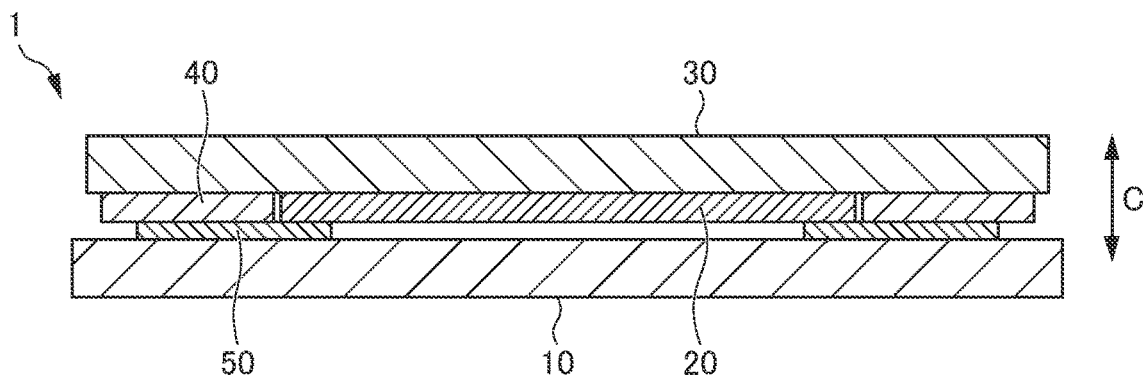
FIG. 11 is a cross-sectional view taken along line B-B in FIG. 10.
Figure 12:
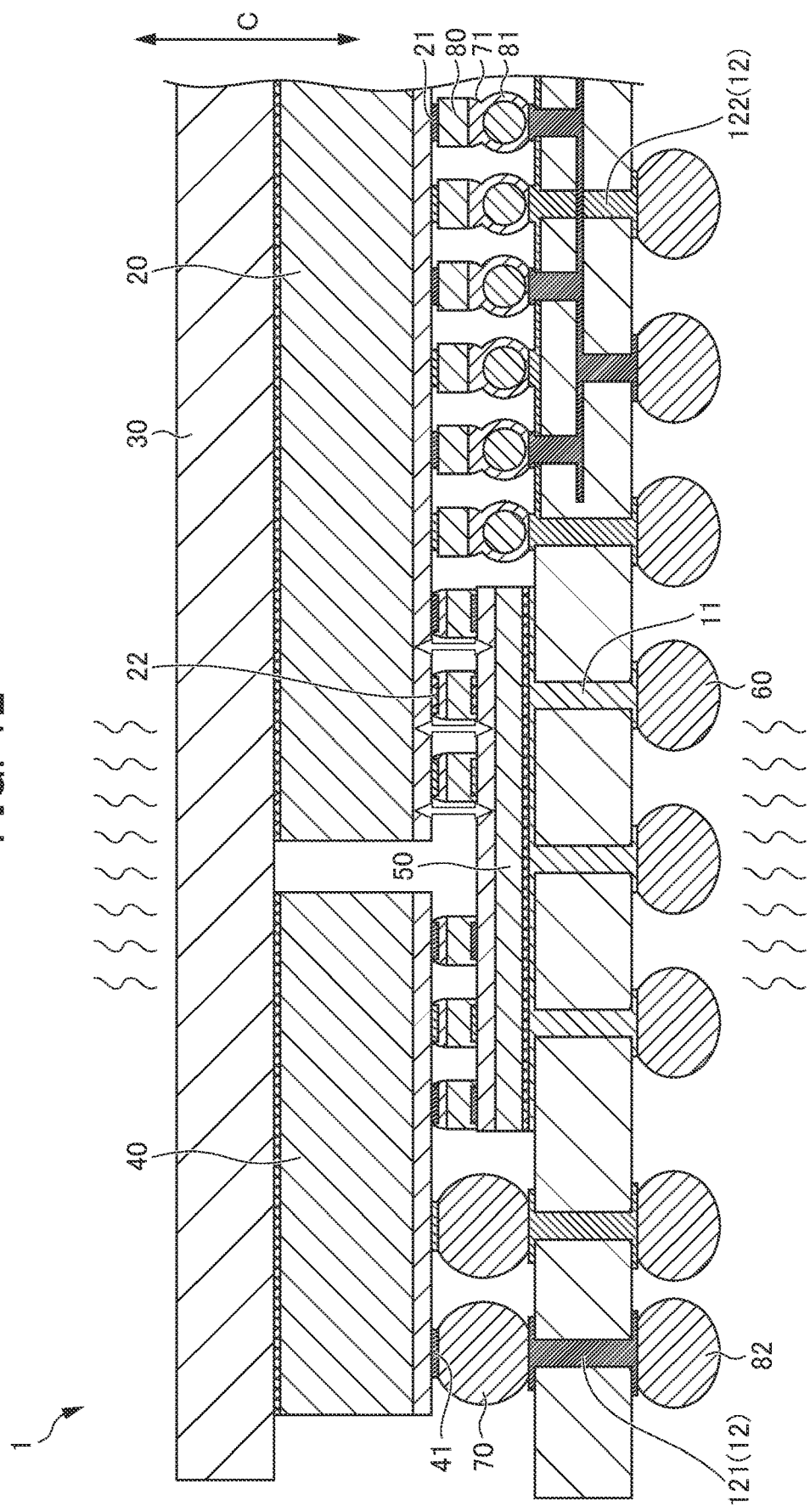
FIG. 12 is a diagram illustrating a portion of FIG. 11 at an enlarged scale.

Next, a semiconductor module 1 and a semiconductor member 100 according to a second embodiment of the present invention, and a method for manufacturing the semiconductor module and member will be described with reference to FIGS. 10 to 17. In the description of the second embodiment, the same components as those of the above-described embodiment will be denoted by the same reference characters, and a description of the same components will be omitted or simplified. As illustrated in FIGS. 10 to 12, the semiconductor module 1 according to the second embodiment differs from that of the first embodiment in that in the second embodiment, a heat spreader 30 is adjacent to power supply units 40 in a thickness direction C. Further, the semiconductor module 1 according to the second embodiment differs from that of the first embodiment in that each power supply unit 40 of the second embodiment is configured as a power supply die including therein, for example, a power supply circuit (not illustrated), a capacitor (not illustrated), and an inductor (not illustrated). Moreover, the semiconductor module 1 according to the second embodiment differs from that of the first embodiment in that the semiconductor module 1 of the second embodiment has the semiconductor member 100 as a semi-finished product of the semiconductor module 1.

Each power supply unit 40 has the same or substantially the same thickness as that of a MPU 20. Each power supply unit 40 is juxtaposed with the MPU 20 in an in-plane direction of an exposed surface of the MPU 20. For example, as illustrated in FIG. 10, the power supply units 40 are respectively disposed to be adjacent to the four sides of the exposed surfaces of the MPU 20. In other words, each power supply unit 40 is disposed such that one of its side surfaces faces one of the side surfaces of the MPU 20.

Figure 13:
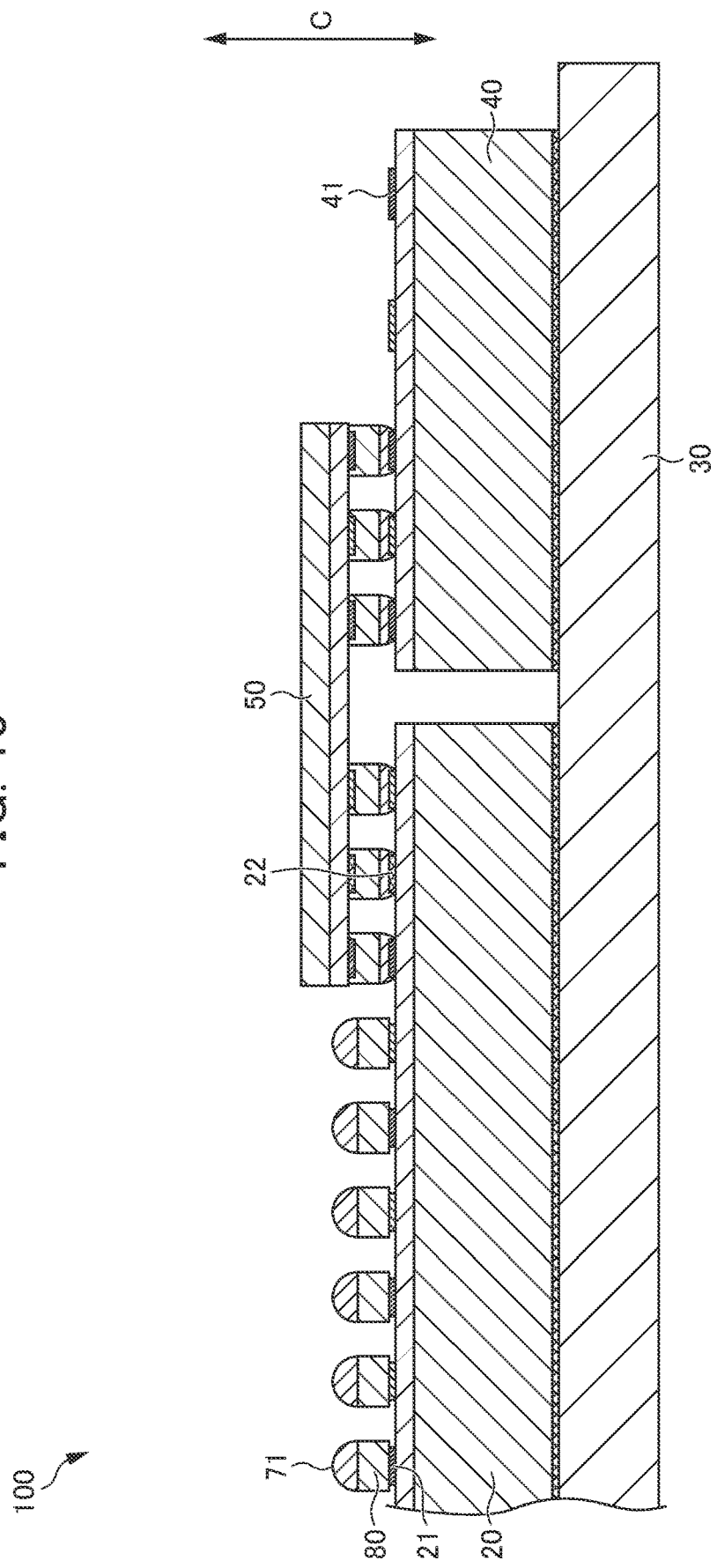
FIG. 13 is a diagram schematically illustrating a step of a process for manufacturing the semiconductor module of the second embodiment.

As illustrated in FIG. 13, the semiconductor member 100 is a semi-finished product corresponding to the semiconductor module 1 excluding a support substrate 10, power supply balls 82, and heat dissipation balls 60. Thus, in the semiconductor member 100, part of a plurality of logic chip-power supply terminals 21, part of a plurality of logic chip-signal terminals 22, and part of a plurality of power supply unit-power supply terminals 41 are connected to a RAM unit 50. On the other hand, another part of the plurality of logic chip-power supply terminals 21 and another part of the plurality of power supply unit-power supply terminals 41 are exposed and connectable to a different module.

Figure 14:
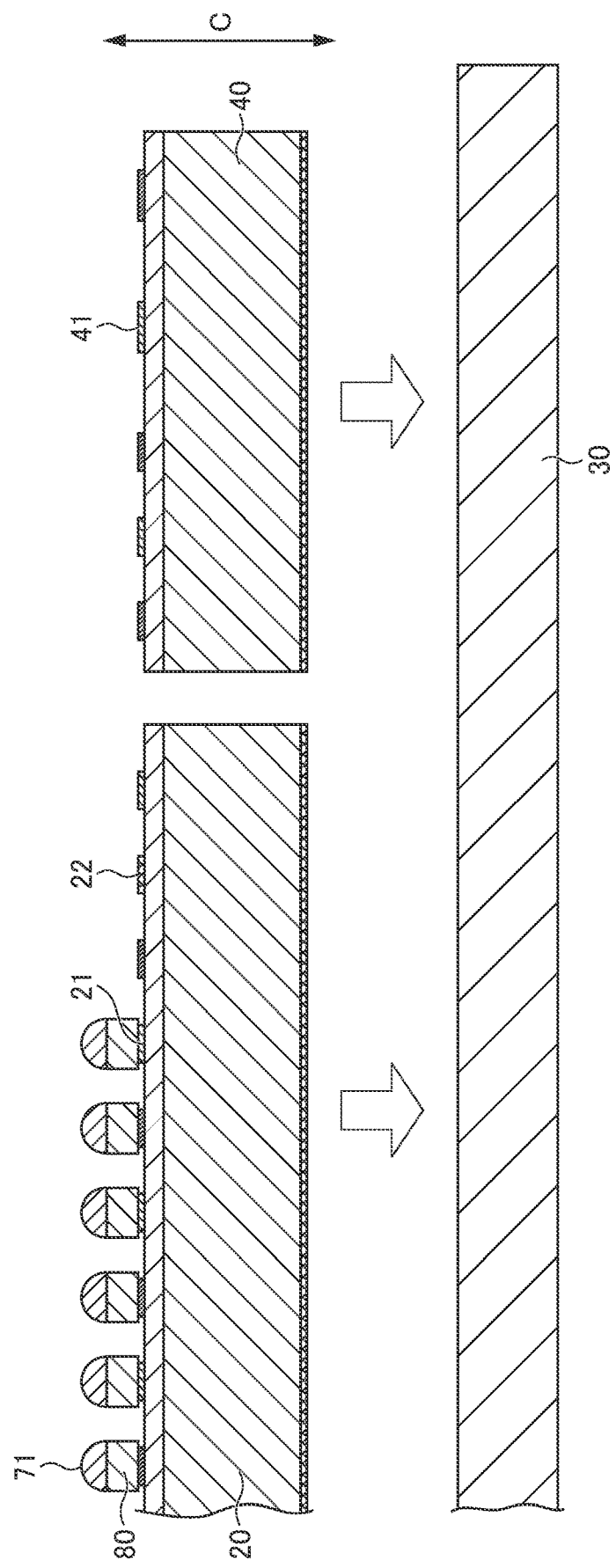
FIG. 14 is a diagram schematically illustrating a step of the process for manufacturing the semiconductor module of the second embodiment.

Next, a method for manufacturing the semiconductor module 1 and the semiconductor member 100 of the present embodiment will be described with reference to FIGS. 13 to 17. First, as illustrated in FIG. 14, the MPU 20 and the power supply units 40 are disposed adjacent to each other over one surface of the heat spreader 30. The MPU 20 and the power supply units 40 are disposed over the one surface of heat spreader 30 such that their exposed surfaces face upward. The MPU 20 and the power supply units 40 are disposed over the one surface of the heat spreader 30 with the interposition of grease (a thermally conductive material).

Figure 15:
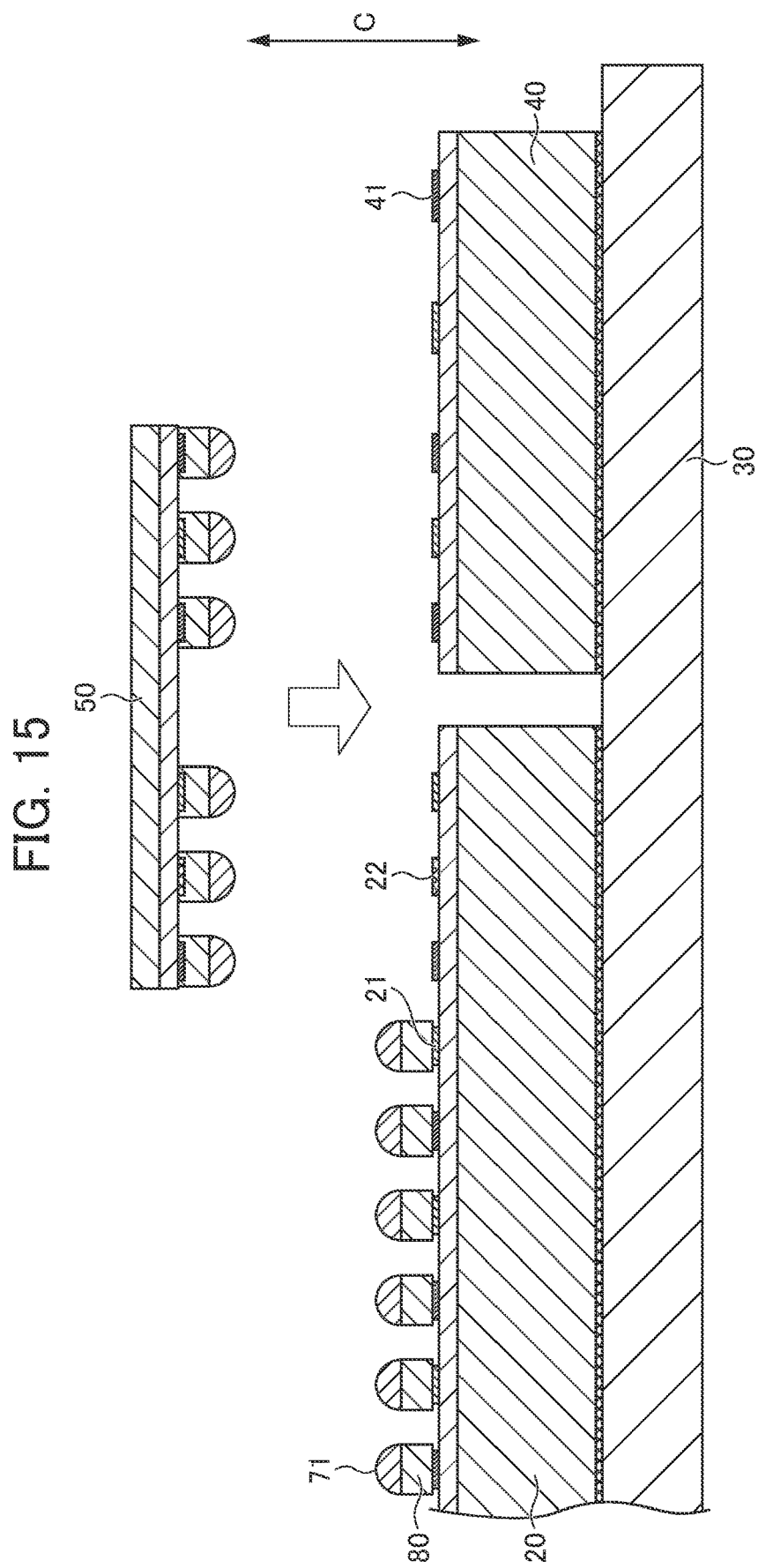
FIG. 15 is a diagram schematically illustrating a step of the process for manufacturing the semiconductor module of the second embodiment.

Next, as illustrated in FIG. 15, the RAM units 50 are each disposed across the MPU 20 and the power supply unit 40. Specifically, the RAM unit 50 is disposed while having its opposing surface facing the exposed surface of the MPU 20 and the exposed surface of the power supply unit 40. The RAM unit 50 is electrically connected to the part of the plurality of logic chip-power supply terminals 21, the part of the plurality of logic chip-signal terminals 22 of the MPU 20, and the part of the power supply units 41 of the power supply unit 40. Due to this configuration, another part of the logic chip-power supply terminals 21 and another part of the power supply units of the power supply unit 40 are maintained exposed. Consequently, as illustrated in FIG. 13, each RAM unit 50 is electrically connected to the MPU 20 and the power supply unit 40.

Figure 16:
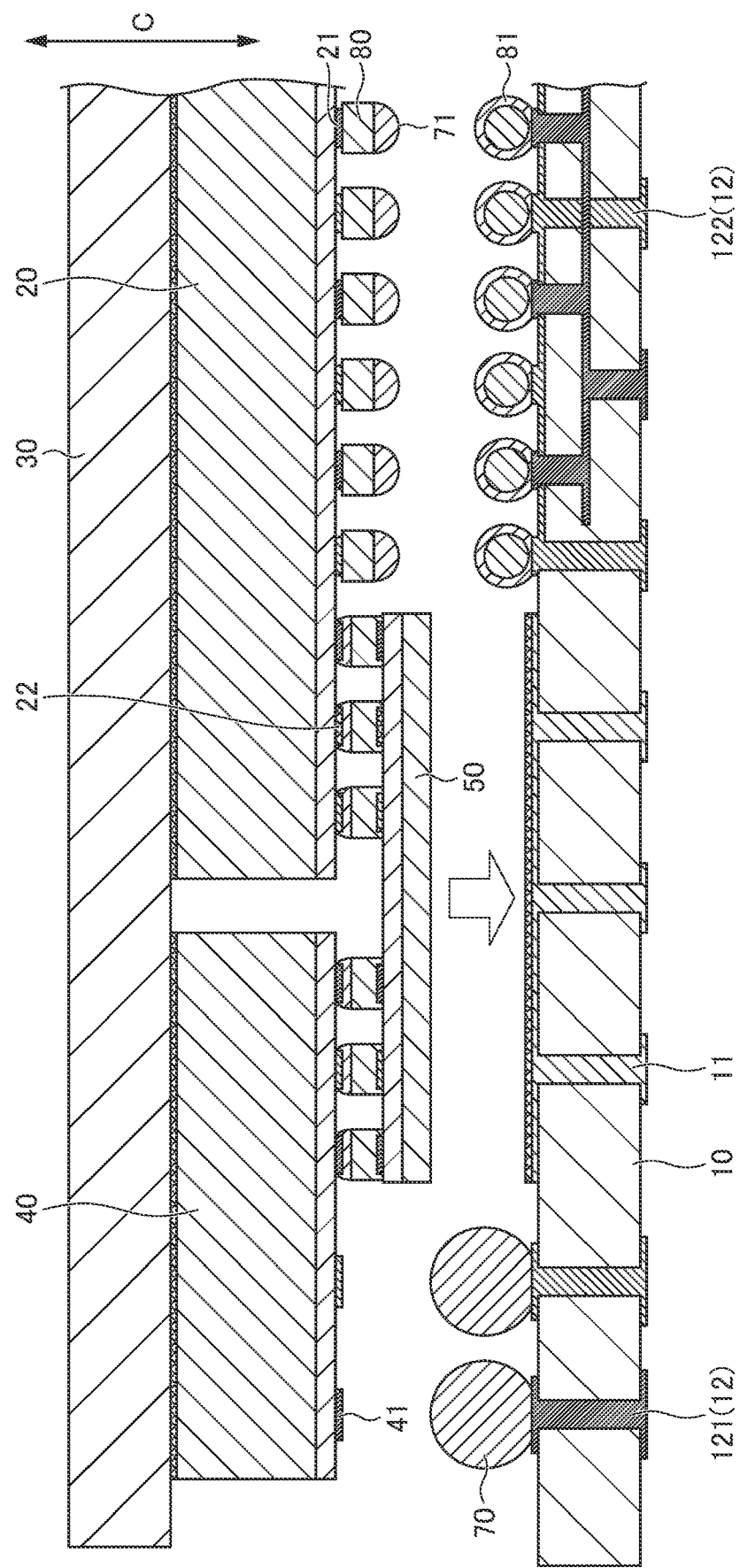
FIG. 16 is a diagram schematically illustrating a step of the process for manufacturing the semiconductor module of the second embodiment.

Next, as illustrated in FIG. 16, the support substrate 10 is superimposed over the heat dissipation surfaces of the RAM units 50. Further, the support substrate 10 is electrically connected to the MPU 20 and the power supply units 40. For example, grease (a thermally conductive material) is applied to a portion of one main surface of the support substrate 10, the portion to be superimposed over the RAM unit 50. Further, on the support substrate 10, Cu core balls 81 are disposed at positions to be connected to the MPU 20. On the support substrate 10, solder balls 70 are disposed at positions to be connected to the power supply units 40. In this way, the support substrate 10 is electrically connected to the MPU 20. Further, the support substrate 10 is electrically connected to the power supply units 40. Thereafter, sealing with an underfill material (not illustrated) is provided, as described above with reference to FIG. 3.

Figure 17:
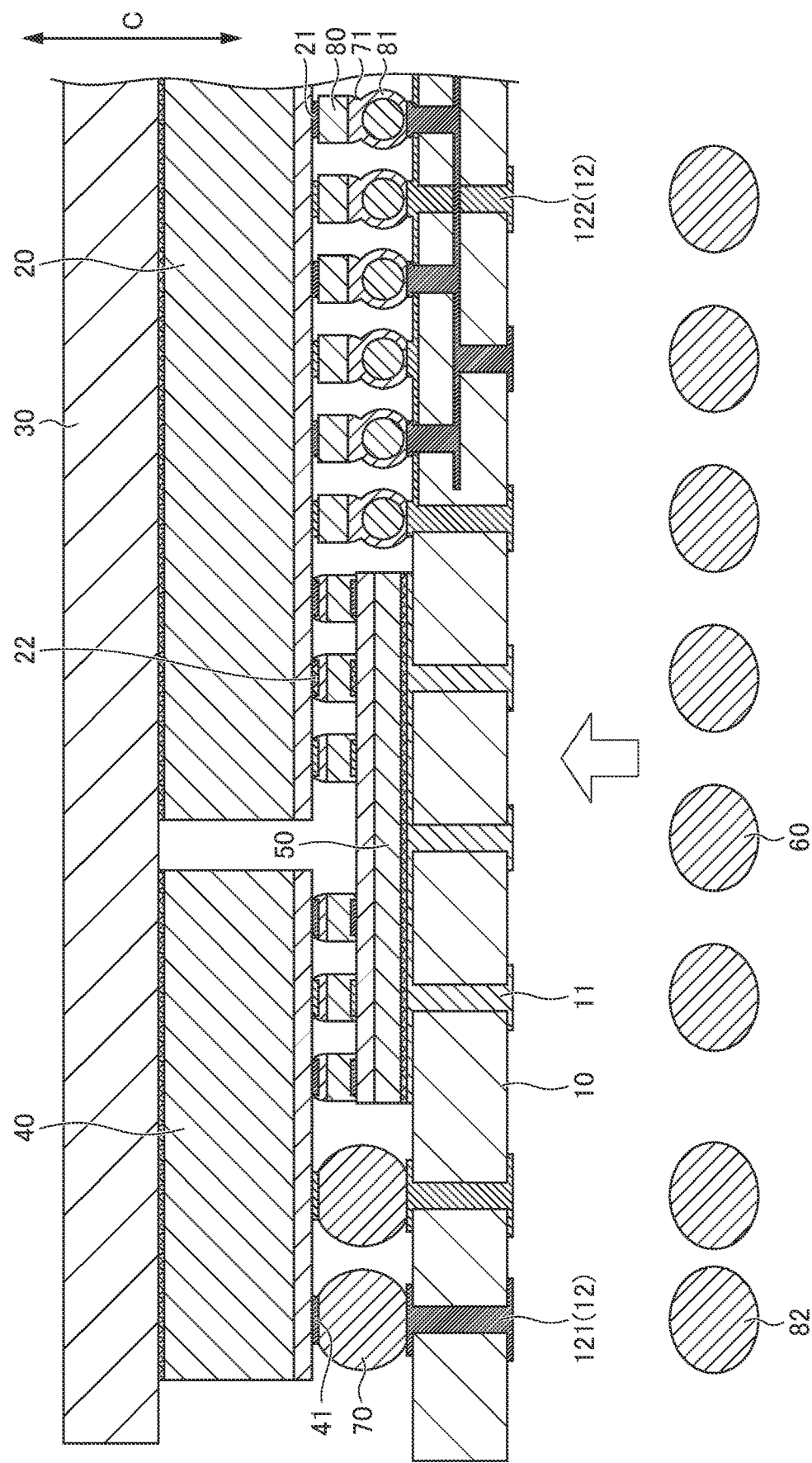
FIG. 17 is a diagram schematically illustrating a step of the process for manufacturing the semiconductor module of the second embodiment.

Next, as illustrated in FIG. 17, power supply balls 82 for connection with a different support substrate 10 are disposed on the other main surface of the support substrate 10. Further, heat dissipation balls 60 to be connected to heat dissipation vias 11 are disposed on the other main surface of the support substrate 10.

The above-described semiconductor module 1 and semiconductor member 100 according to the second embodiment, and the method for manufacturing the semiconductor module 1 and the semiconductor member 100 exert the following effects.

(3) The power supply units 40 are disposed over the surface of the heat spreader 30 where the logic chip is also disposed. This feature makes it possible to dispose the power supply units 40 adjacent to the heat spreader 30, thereby allowing the power supply units 40 to be cooled more efficiently. Thus, the entire semiconductor module 1 can be cooled with enhanced efficiency, thereby making it possible for the semiconductor module 1 to improve in reliability. Further, since fixing the MPU 20 and the power supply units 40 to the heat spreader 30 is followed by connection to the RAM units 50, the manufacturing process can be made easy.

Moreover, since accuracy of positioning of bumps is increased, the yields can be improved and the manufacturing costs can be reduced.

(4) The semiconductor member 100 includes: the heat spreader 30; the logic chip disposed adjacent to one surface of the heat spreader 30, having the exposed surface opposite to a surface adjacent to the heat spreader 30, and including the plurality of logic chip-power supply terminals 21 and the plurality of logic chip-signal terminals 22 on the exposed surface; the power supply unit 40 disposed over the surface of the heat spreader 30 where the logic chip is disposed, having the exposed surface opposite to a surface adjacent to the heat spreader 30, and including the plurality of power supply unit-power supply terminals 41 on the exposed surface; and the RAM unit 50 as a RAM module having the opposing surface facing the exposed surface of the logic chip and the exposed surface of the power supply unit 40, and disposed across part of the plurality of logic chip-power supply terminals 21, part of the plurality of logic chip-signal terminals 22, and part of the plurality of power supply unit-power supply terminals 41. Another part of the plurality of logic chip-power supply terminals 21 and another part of the plurality of power supply unit-power supply terminals 41 are exposed and connectable to a different module. With this feature, while the semiconductor member 100 has been manufactured, the semiconductor module 1 can be manufactured in a different place. Further, the semiconductor member 100 can be easily disposed on the support substrate 10 together with, for example, other module and component. Thus, the method for manufacturing the semiconductor module 1 can be improved in general versatility.

Third Embodiment

Figure 18:
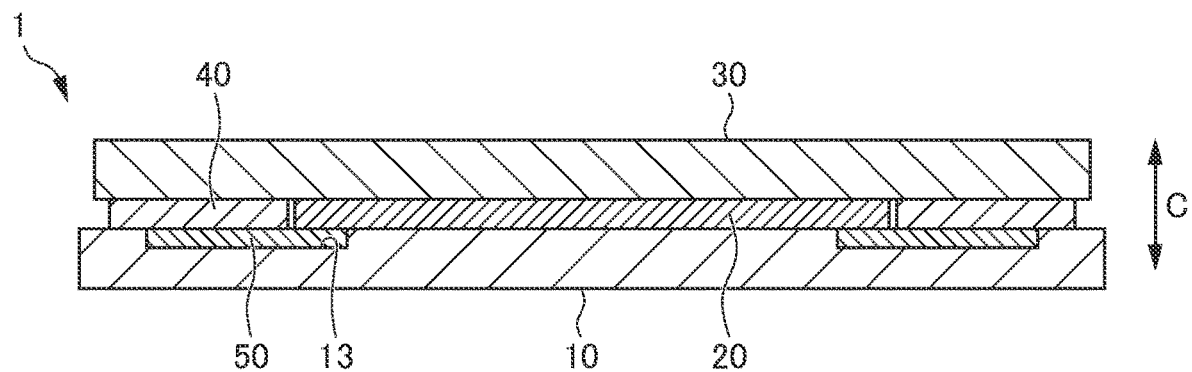
FIG. 18 is a cross-sectional view of a semiconductor module according to a third embodiment of the present invention.
Figure 19:
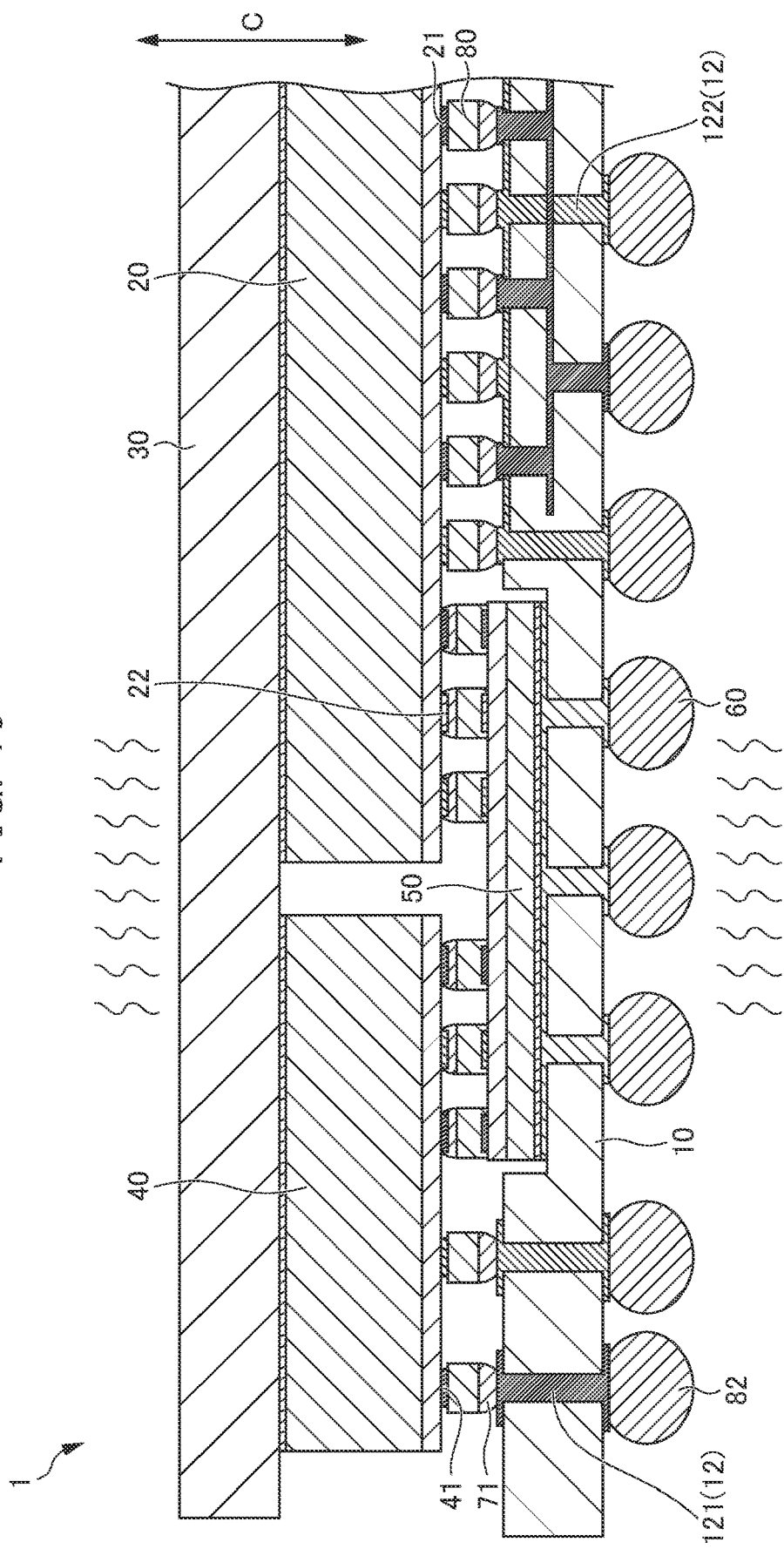
FIG. 19 is a diagram illustrating a portion of FIG. 18 at an enlarged scale.

Next, a semiconductor module 1 according to a third embodiment of the present invention and a method for manufacturing the semiconductor module 1 will be described with reference to FIGS. 18 and 19. In the description of the third embodiment, the same components as those of the above-described embodiments will be denoted by the same reference characters, and a description of the same components will be omitted or simplified. As illustrated in FIGS. 18 and 19, the semiconductor module 1 according to the third embodiment differs from that of the second embodiment in that a support substrate 10 of the third embodiment has, on one main surface, recesses 13 that are recessed in a thickness direction C and are formed at positions over which RAM units 50 are superimposed.

Each recess 13 has a depth that enables connection to the MPU 20 and the power supply unit 40 only by means of Cu pillars 80 and solder bumps 71 provided on one main surface of the support substrate 10, without having to provide Cu core balls 81 or solder balls 70 on the one main surface of the support substrate 10. Each recess 13 has a shape and an area that allow the RAM unit 50 to be received in the recess 13. As described above with reference to FIG. 3, the connection portions and the RAM units 50 are sealed with an underfill material (not illustrated).

The above-described semiconductor module 1 and the semiconductor member 100 according to the third embodiment, and the method for manufacturing the same exert the following effects.

(5) The support substrate 10 has, on the one main surface, the recesses 13 that are recessed in the thickness direction C and are formed at positions over which the RAM units 50 are superimposed. This feature can shorten a distance between the support substrate 10 and the MPU 20 and a distance between the support substrate 10 and the power supply units 40. Thus, the semiconductor module 1 can be fabricated without using the Cu core balls 81 or the solder balls 70, whereby the manufacturing costs of the semiconductor module 1 can be reduced.

Fourth Embodiment

Figure 20:
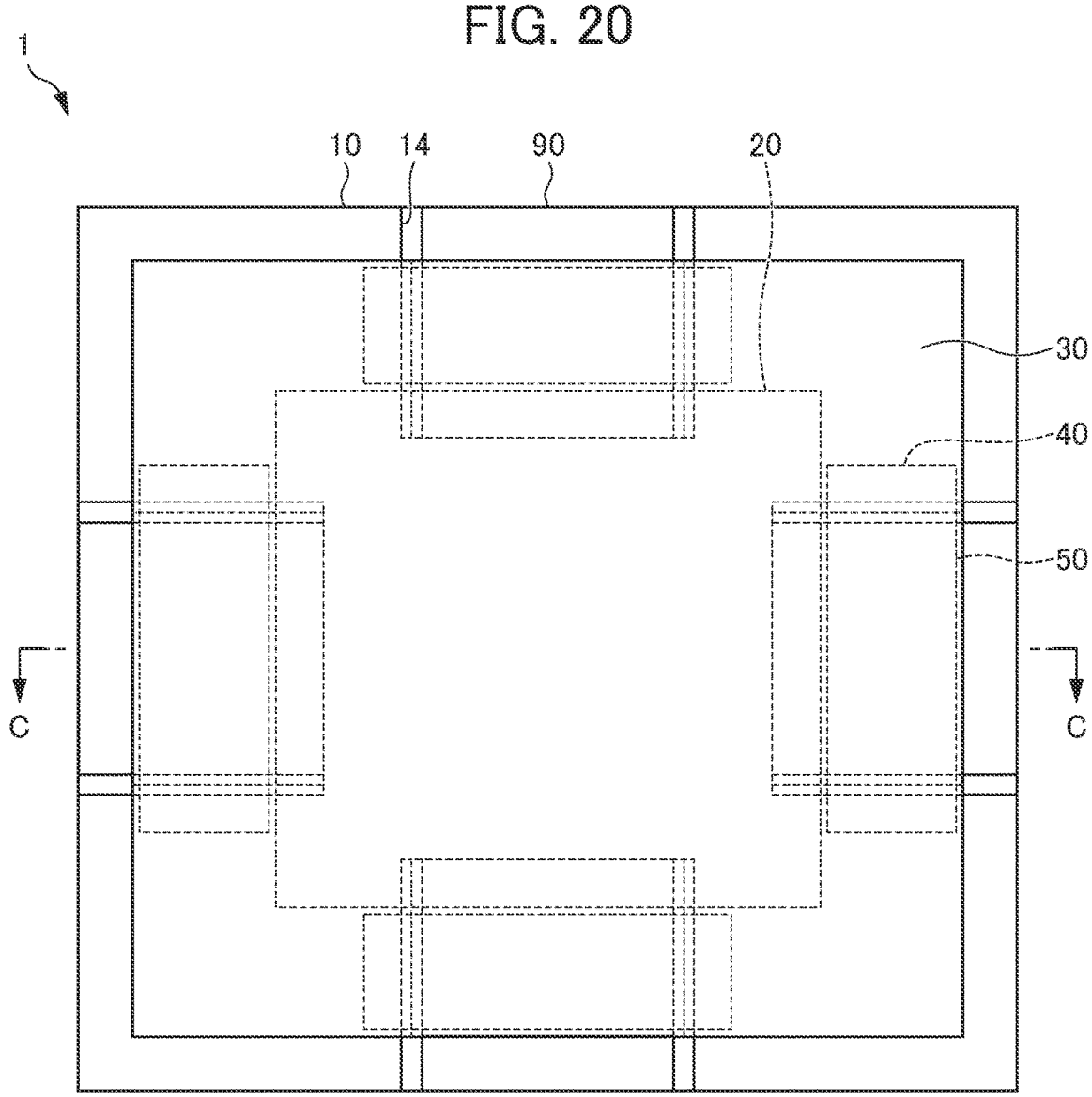
FIG. 20 is a planar view illustrating a semiconductor module according to a fourth embodiment of the present invention.
Figure 21:
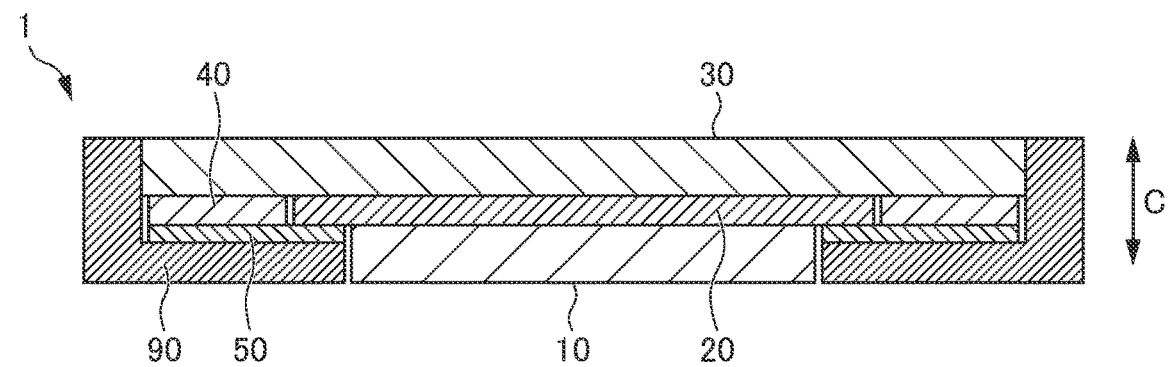
FIG. 21 is a cross-sectional view taken along line C-C in FIG. 20.
Figure 22:
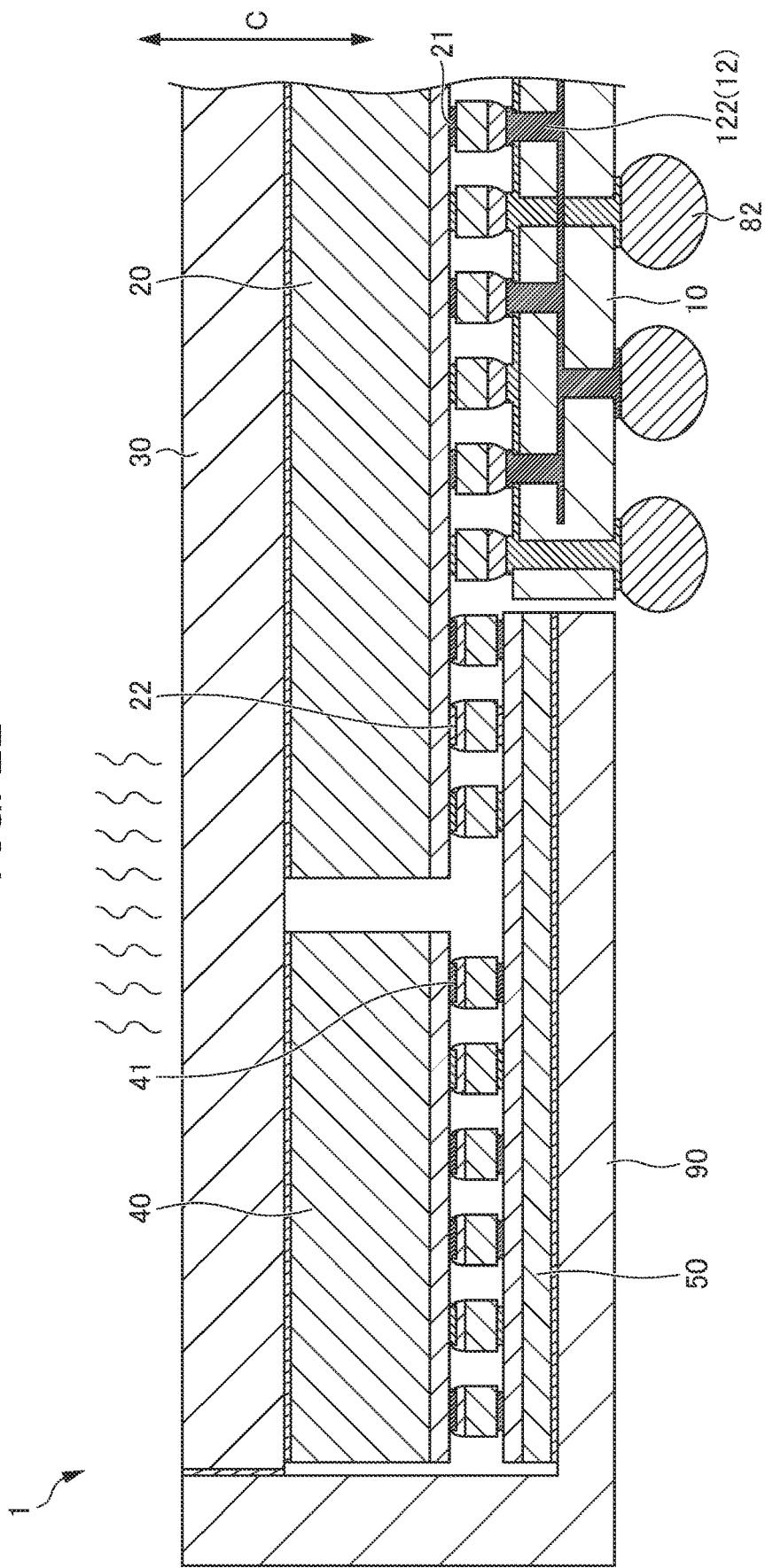
FIG. 22 is a diagram illustrating a portion of FIG. 21 at an enlarged scale.

Next, a semiconductor module 1 according to a fourth embodiment of the present invention and a method for manufacturing the semiconductor module 1 will be described with reference to FIGS. 20 to 22. As illustrated in FIGS. 20 to 22, the semiconductor module 1 of the fourth embodiment differs from those of the second and third embodiments in that according to the fourth embodiment, with respect to an in-plane direction of an exposed surface of a MPU 20 and an exposed surface of each power supply unit 40, an outer edge of the exposed surface of the power supply unit 40 is positioned to an outer edge of an opposing surface of a RAM unit 50, in a direction from the power supply unit 40 to the MPU 20. The semiconductor module 1 of the fourth embodiment includes a support substrate 10 that has notches in its portions to be superimposed over the RAM units 50. This feature constitutes another difference from the second and third embodiments. Further, the semiconductor module 1 of the fourth embodiment further includes heat dissipation plates 90. This feature constitutes yet another difference from the second and third embodiments. In the present embodiment, each power supply unit 40 has a portion not being superimposed over the RAM unit 50, the portion extending in a direction along a side facing the MPU 20. By way of the portion not being superimposed over the RAM unit 50, the power supply unit 40 is electrically connected to the support substrate 10. As described above with reference to FIG. 3, the connection portions and the RAM units 50 are sealed with an underfill material (not illustrated).

As illustrated in FIG. 20, the support substrate 10 has, in each of four side portions, the notch 14. For example, the support substrate 10 has the notches 14 each of which can receive therein the RAM unit 50. The support substrate 10 of the present embodiment have the notches 14 formed by indenting the four side portions.

The heat dissipation plate 90 is disposed adjacent to the heat dissipation surface of the RAM unit 50. For example, the heat dissipation plate 90 is disposed adjacent to the heat dissipation surface of the RAM unit 50 with the interposition of grease (a thermally conductive material). In the present embodiment, the heat dissipation plate 90 has an L-shape composed of two parts, one of which is disposed along the heat dissipation surface of the RAM unit 50 and the other of which rises in a thickness direction C. A leading end of the other part of the heat dissipation plate 90 in a direction in which the other part rises is connected to a side surface of a heat spreader 30 with the interposition of grease (a thermally conductive material).

The above-described semiconductor module 1 according to the fourth embodiment and the method for manufacturing the semiconductor module 1 exert the following effects.

(6) The semiconductor module 1 includes: the heat spreader 30; the logic chip disposed adjacent to one surface of the heat spreader 30, having the exposed surface opposite to a surface adjacent to the heat spreader 30, and including a plurality of logic chip-power supply terminals 21 and a plurality of logic chip-signal terminals 22 on the exposed surface; the power supply unit 40 juxtaposed with the logic chip in an in-plane direction of the exposed surface of the logic chip, having the exposed surface facing an identical direction with respect to the exposed surface of the logic chip, and including a plurality power supply terminals for the power supply unit 40 on the exposed surface thereof; the RAM unit 50 as a multilayer RAM module having an opposing surface facing the exposed surface of the logic chip and the exposed surface of the power supply unit 40, and disposed across part of the plurality of logic chip-signal terminals 22 and at least part of the plurality of power supply terminals for the power supply unit 40; the support substrate 10 including a power supply circuit 12 capable of supplying electric power to the logic chip and the power supply unit 40, and facing the exposed surface of the logic chip or the exposed surfaces of the power supply unit 40; and the heat dissipation plate 90 disposed adjacent to the heat dissipation surface of the RAM unit 50. This feature can further enhance heat dissipation efficiency of the RAM unit 50.

In the foregoing, preferred embodiments of the semiconductor module, the semiconductor member, and the method for manufacturing the semiconductor module and member of the present invention have been described. Note that the above-described embodiments are not intended to limit the present invention, and various modification can be made to the present invention.

For example, in the above embodiments, the surface of the heat dissipation ball 60 is exposed, except for the portion connected to the heat dissipation via 11. However, this is a non-limiting example. The heat dissipation ball 60 may be connected to, for example, ground.

Further, the arithmetic unit is not limited to the MPU 20, and may be widely applied to the general logic chips. The memory is not limited to DRAM, and may be widely applied to general RAM (random access memory) including non-volatile RAM (e.g., MRAM, ReRAM, FeRAM, etc.).

EXPLANATION OF REFERENCE NUMERALS

1: Semiconductor Module
10: Support Substrate
11: Heat Dissipation Via
12: Power Supply Circuit
13: Recess
20: MPU
21: Logic Chip-Power Supply Terminal
22: Logic Chip-Signal Terminal
30: Heat Spreader
40: Power Supply Unit
41: Power Supply Unit-Power Supply Terminal
42: Bypass Capacitor
50: RAM Unit
60: Heat Dissipation Ball
70: Solder Ball
71: Solder Bump
80: Cu Pillar
81: Cu Core Ball
82: Power Supply Ball
90: Heat Dissipation Plate
100: Semiconductor Member
C: Thickness Direction

The invention claimed is:

1. A semiconductor module comprising:
a heat spreader;
a logic chip disposed adjacent to one surface of the heat spreader, having a surface adjacent to the heat spreader and an exposed surface opposite to the surface, and including a plurality of logic chip-power supply terminals and a plurality of logic chip-signal terminals on the exposed surface;
a power supply unit juxtaposed with the logic chip in an in-plane direction of the exposed surface of the logic chip, having an exposed surface facing an identical direction with respect to the exposed surface of the logic chip, and including a plurality of power supply unit-power supply terminals on the exposed surface thereof;
a RAM unit as a RAM module having an opposing surface facing the exposed surface of the logic chip and the exposed surface of the power supply unit, and disposed across part of the plurality of logic chip-signal terminals and part of the plurality of power supply unit-power supply terminals; and
a support substrate including a power supply circuit capable of supplying electric power to the logic chip and the power supply unit, and having one main surface adjacent to a heat dissipation surface of the RAM unit opposite to the opposing surface,
wherein the support substrate is electrically connected to at least part of the logic chip-power supply terminals and another part of the power supply unit-power supply terminals by means of the power supply circuit, and has, in a portion over which the RAM unit is superimposed, a heat dissipation via that is in contact with the heat dissipation surface of the RAM unit and penetrates the support substrate in a thickness direction.

2. The semiconductor module according to claim 1, wherein the power supply unit is disposed over the surface of the heat spreader where the logic chip is disposed.

3. The semiconductor module according to claim 1, wherein the support substrate has, on the one main surface, a recess that is recessed in the thickness direction, and is formed at a position over which the RAM unit is superimposed.

4. A semiconductor module comprising:
a heat spreader;
a logic chip disposed adjacent to one surface of the heat spreader, having a surface adjacent to the heat spreader and an exposed surface opposite to the surface, and including a plurality of logic chip-power supply terminals and a plurality of logic chip-signal terminals on the exposed surface;
a power supply unit juxtaposed with the logic chip in an in-plane direction of the exposed surface of the logic chip, having an exposed surface facing an identical direction with respect to the exposed surface of the logic chip, and including a plurality of power supply unit-power supply terminals on the exposed surface thereof;
a RAM unit as a RAM module having an opposing surface facing the exposed surface of the logic chip and the exposed surface of the power supply unit, and disposed across part of the plurality of logic chip-signal terminals and part of the plurality of power supply unit-power supply terminals;
a support substrate including a power supply circuit capable of supplying electric power to the logic chip and the power supply unit, and facing the exposed surface of the logic chip or the exposed surfaces of the power supply unit; and
a heat dissipation plate disposed adjacent to a heat dissipation surface of the RAM unit.

5. A semiconductor member for use as a component for manufacturing a semiconductor module, the semiconductor member comprising:
- a heat spreader;
- a logic chip disposed adjacent to one surface of the heat spreader, having a surface adjacent to the heat spreader and an exposed surface opposite to the surface, and including a plurality of logic chip-power supply terminals and a plurality of logic chip-signal terminals on the exposed surface;
- a power supply unit disposed over the surface of the heat spreader where the logic chip is disposed, having a surface adjacent to the heat spreader and an exposed surface opposite to the surface, and including a plurality of power supply unit-power supply terminals on the exposed surface thereof; and
- a RAM unit as a RAM module having an opposing surface facing the exposed surface of the logic chip and the exposed surface of the power supply unit, and disposed across part of the plurality of logic chip-signal terminals and part of the plurality of power supply unit-power supply terminals,
- wherein at least part of the plurality of logic chip-power supply terminals and another part of the plurality of power supply unit-power supply terminals are exposed and connectable to a different module.

6. The semiconductor module according to claim 1, further comprising:
- a heat dissipation ball connected to one end of the heat dissipation via, and disposed on a surface of the support substrate opposite to the surface facing the RAM unit.

7. A method for manufacturing a semiconductor module, the method comprising:
- electrically connecting a RAM unit as a RAM module to a logic chip such that a portion of an opposing surface as one surface of the RAM unit faces a portion of an exposed surface as one surface of the logic chip;
- electrically connecting the RAM unit to a power supply unit such that another portion of the opposing surface of the RAM unit faces a portion of an exposed surface as one surface of the power supply unit;
- disposing a heat spreader adjacent to another surface of the logic chip opposite to the exposed surface;
- disposing a support substrate such that one main surface of the support substrate becomes adjacent to a heat dissipation surface of the RAM unit opposite to the opposing surface, while bringing a heat dissipation via penetrating the support substrate in a thickness direction into contact with the heat dissipation surface; and
- connecting a heat dissipation ball to one end of the heat dissipation via, on another main surface of the support substrate opposite to the surface facing the RAM unit.

* * * * *